(12) United States Patent
Nakamura et al.

(10) Patent No.: US 7,994,711 B2
(45) Date of Patent: Aug. 9, 2011

(54) LIGHT EMITTING DEVICE AND MANUFACTURING METHOD THEREOF

(75) Inventors: Yasuo Nakamura, Tokyo (JP); Noriko Shibata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1060 days.

(21) Appl. No.: 11/462,307

(22) Filed: Aug. 3, 2006

(65) Prior Publication Data

US 2007/0029929 A1 Feb. 8, 2007

(30) Foreign Application Priority Data

Aug. 8, 2005 (JP) ................................ 2005-229439

(51) Int. Cl.
*H01L 29/201* (2006.01)
(52) U.S. Cl. .......................... 313/506; 313/504; 257/90
(58) Field of Classification Search ................. 313/504, 313/506; 257/90
See application file for complete search history.

(56) References Cited

U.S. PATENT DOCUMENTS

| | | | |
|---|---|---|---|
| 5,989,737 A | 11/1999 | Xie et al. | |
| 7,161,184 B2* | 1/2007 | Miyagi et al. | 257/88 |
| 7,173,373 B2* | 2/2007 | Yamada et al. | 313/505 |
| 7,221,095 B2 | 5/2007 | Yamazaki et al. | |
| 7,455,564 B2 | 11/2008 | Matsumoto et al. | |
| 7,456,811 B2* | 11/2008 | Kwak | 313/505 |
| 7,579,774 B2* | 8/2009 | Yamazaki et al. | 313/505 |
| 7,619,244 B2 | 11/2009 | Murakami et al. | |
| 2001/0046611 A1 | 11/2001 | Kido et al. | |
| 2002/0158835 A1 | 10/2002 | Kobayashi et al. | |
| 2003/0094895 A1 | 5/2003 | Okuyama et al. | |
| 2003/0189401 A1 | 10/2003 | Kido et al. | |
| 2004/0021414 A1* | 2/2004 | Hanawa et al. | 313/506 |
| 2004/0041753 A1 | 3/2004 | Nakanishi | |
| 2004/0119399 A1 | 6/2004 | Nagayama | |
| 2004/0140758 A1 | 7/2004 | Raychaudhuri et al. | |
| 2004/0256620 A1 | 12/2004 | Yamazaki et al. | |
| 2005/0001546 A1* | 1/2005 | Yamaguchi | 313/512 |
| 2005/0012454 A1* | 1/2005 | Yamazaki et al. | 313/506 |

(Continued)

FOREIGN PATENT DOCUMENTS

EP 1 555 701 A2 7/2005

(Continued)

OTHER PUBLICATIONS

Office Action (Chinese Patent Application No. 200610114840.6) mailed Sep. 25, 2009 with full translation.

(Continued)

*Primary Examiner* — Peter Macchiarolo
(74) *Attorney, Agent, or Firm* — Fish & Richardson P.C.

(57) ABSTRACT

An active matrix light emitting device of which luminance characteristic does not vary among light emitting elements of respective pixels, and which can be realized even in a high definition display panel is disclosed. In the light emitting device, a light emitting material is interposed between a first electrode and a second electrode electrically connected to an auxiliary wiring, not only in a peripheral portion but also in a pixel portion. A layer containing the light emitting material comprises a first buffer layer, a light emitting layer, and a second buffer layer. In the pixel portion, either one or both of the first and the second buffer layer are interposed between the auxiliary wiring and the second electrode where the second electrode and the auxiliary wiring are electrically connected.

43 Claims, 16 Drawing Sheets

U.S. PATENT DOCUMENTS

| | | | |
|---|---|---|---|
| 2005/0037232 A1* | 2/2005 | Tyan et al. | 313/506 |
| 2005/0051776 A1* | 3/2005 | Miyagi et al. | 257/72 |
| 2005/0077816 A1* | 4/2005 | Yamada et al. | 313/503 |
| 2005/0179399 A1 | 8/2005 | Leo et al. | |
| 2005/0271898 A1* | 12/2005 | Kim et al. | 428/690 |
| 2007/0042221 A1* | 2/2007 | Kawamura | 428/690 |
| 2007/0178331 A1* | 8/2007 | Park et al. | 313/506 |
| 2007/0257602 A1 | 11/2007 | Miyagi et al. | |
| 2009/0026922 A1 | 1/2009 | Iwaki et al. | |
| 2009/0212688 A1* | 8/2009 | Song et al. | 313/504 |
| 2009/0286445 A1 | 11/2009 | Yamazaki et al. | |

FOREIGN PATENT DOCUMENTS

| | | |
|---|---|---|
| JP | 03-274695 A | 12/1991 |
| JP | 04-357694 A | 12/1992 |
| JP | 07-312289 A | 11/1995 |
| JP | 10-255985 A | 9/1998 |
| JP | 02824411 B2 | 11/1998 |
| JP | 11-251067 A | 9/1999 |
| JP | 2000-315580 A | 11/2000 |
| JP | 2003-272860 A | 9/2003 |
| JP | 2004-102245 | 4/2004 |
| JP | 2004-349007 A | 12/2004 |
| JP | 2005-026121 A | 1/2005 |
| JP | 2005-031645 A | 2/2005 |
| JP | 2005-038833 A | 2/2005 |
| JP | 2006-156267 A | 6/2006 |
| JP | 2006-324536 A | 11/2006 |
| WO | WO 2004105445 A1 * | 12/2004 |
| WO | WO 2005/031798 A2 | 4/2005 |

OTHER PUBLICATIONS

Nakada et al., "Multi Photon Emission Organic EL Devices using Charge-Transfer Complex as Charge Generation Layer"; The 63rd Applied Physics-related Combined Seminar—Seminar Proceedings; Sep. 1, 2002, p. 1165; vol. 27A-ZL-12; printed in JP.

Tokito et al., "Metal oxides as a hole-injecting layer for an organic electroluminescent device"; J. Phys. D: Appl. Phys. (Journal of Physics D: Applied Physics); 1996; pp. 2750-2753; vol. 29; printed in the UK.

* cited by examiner

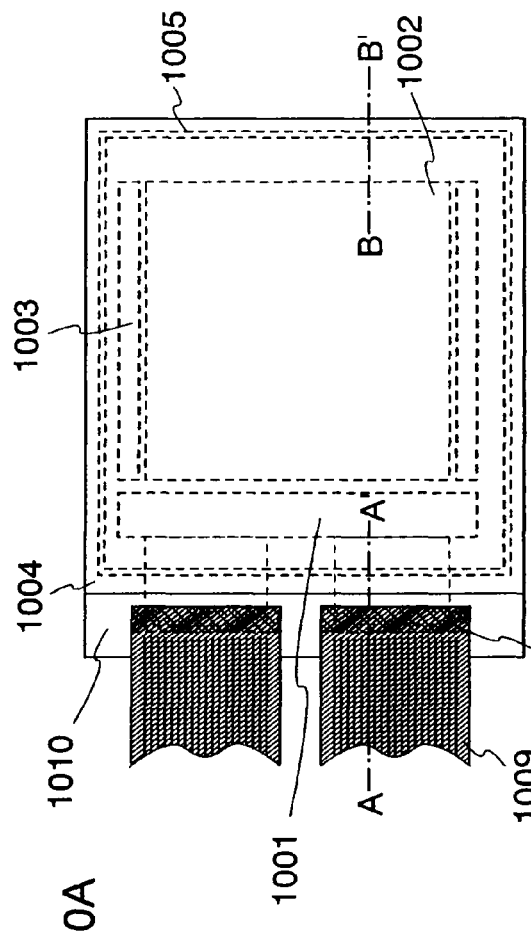
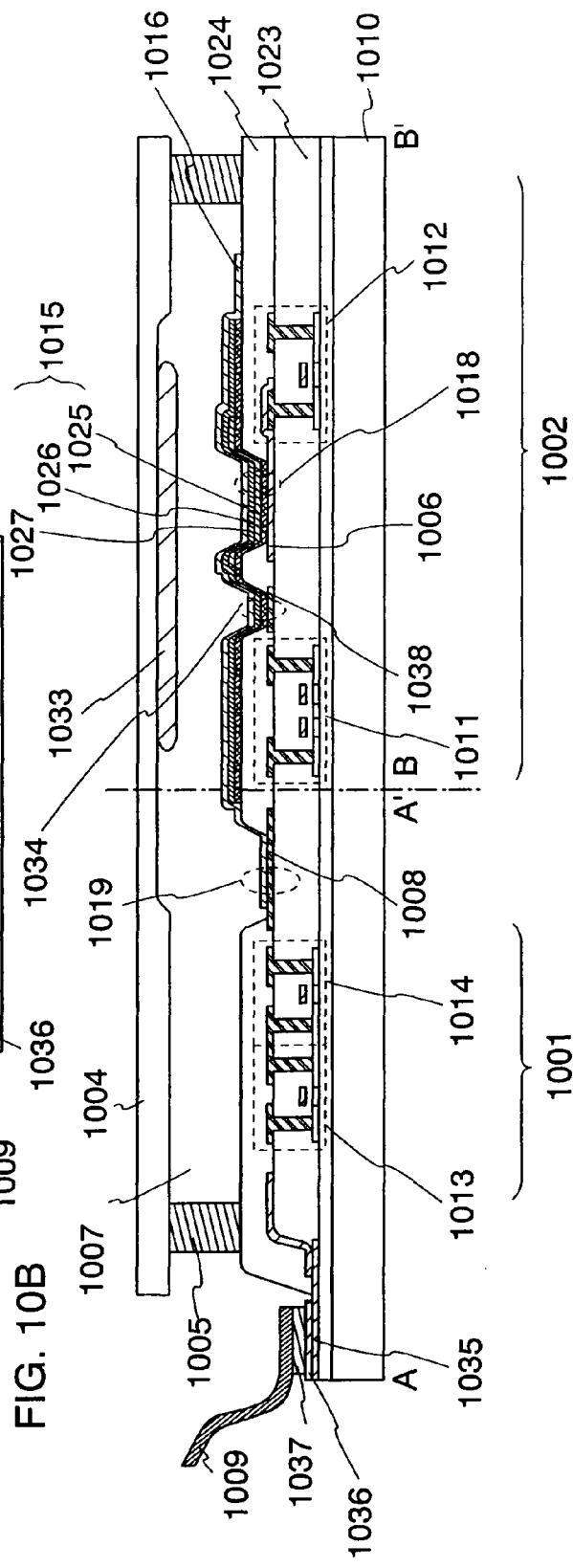
FIG. 10A
FIG. 10B

LIGHT EMITTING DEVICE AND MANUFACTURING METHOD THEREOF

BACKGROUND OF THE INVENTION

1. Field of the Invention

The present invention relates to a light emitting device having a light emitting element, and a manufacturing method thereof.

2. Description of the Related Art

A light emitting element having a light emitting material interposed between a pair of electrodes (an anode and a cathode), which is thin, light, and capable of fast response, is expected to be applied to a next-generation flat panel display. Furthermore, a light-emitting device in which light emitting elements are arranged in a matrix is said to be superior to a conventional liquid crystal display device in that it has wider view angle and higher visibility.

A simple matrix mode and an active matrix mode can be given as driving methods of a light emitting device, and the active matrix mode using an active element such as a thin film transistor (TFT) is adopted in many cases for high-definition panels (for example, a panel having more pixels than QVGA).

In the case of an active matrix light emitting device, a TFT formed in each pixel in a pixel portion is electrically connected to a light emitting element, and the light emitting element has a structure in which a light emitting material is interposed between one electrode (hereinafter referred to as a first electrode) connected to the TFT and the other electrode (hereinafter referred to as a second electrode). The second electrode of the light emitting element is formed of one conductive film which is common to all light emitting elements in the pixel portion.

However, as the number of pixels is increased to realize a higher definition panel, the second electrode formed of the conductive film which is common to all pixels comes to have more voltage drop due to material resistance of the electrode or the like, and a voltage applied from the second electrode varies among light emitting elements in respective pixels. Since luminance of a light emitting element depends on a current amount, the voltage variation leads to variation in luminance of light emitting elements.

With respect to this problem, a method in which a wiring structure and a wiring layout are optimized so that a driving voltage or a current is supplied stably to light emitting elements of respective pixels has been employed. (For example, Patent Document 1: Japanese Patent Laid-Open No. 2004-102245)

However, in the case of the above-mentioned Patent Document 1, in order to reduce voltage drop due to the resistance of a connection wiring of a second electrode, the connection wiring for the second electrode is formed at the periphery of a pixel portion, with a wider line width than that of a power supply wiring for light emission, which is not favorable when it is desired to decrease a non-active area of the panel (when it is desired to reduce the frame size).

SUMMARY OF THE INVENTION

In view of the foregoing problem, it is an object of the present invention to provide an active matrix light emitting device of which luminance characteristic does not vary among light emitting elements of respective pixels, and which can be realized even when a panel has higher definition.

A light emitting device of the present invention comprises a first electrode and a second electrode between which a light emitting element having a layer containing a light emitting material is interposed. One feature of this light emitting device is that the second electrode is electrically connected to an auxiliary wiring not only in a peripheral portion but also in a pixel portion.

The layer containing a light emitting material included in a light emitting element of the present invention can compromise a first buffer layer, a hole transporting layer, a light emitting layer, an electron transporting layer, and a second buffer layer. A feature of this layer is that it comprises at least the first buffer, the light emitting layer, and the second buffer. In a pixel portion, an electrical connection portion (a first connection portion) between the second electrode and an auxiliary wiring (a first auxiliary wiring) is formed, where either one or both of the first buffer layer and the second buffer layer are interposed between the first auxiliary wiring and the second electrode.

In a peripheral portion, connection portion (a second connection portion) between the second electrode and another auxiliary wiring (a second auxiliary wiring) is formed. Here, the second auxiliary wiring and the second electrode are formed in contact with each other.

One feature of a method for manufacturing a light emitting device according to the present invention is to include the steps of: forming a first electrode, a first auxiliary wiring, and a second auxiliary wiring; forming a first buffer layer over the first electrode and the first auxiliary wiring; forming a light emitting layer over the first electrode; forming a second buffer layer over the first electrode and the first auxiliary wiring; and forming a second electrode over the first electrode, the first auxiliary wiring, and the second auxiliary wiring. As a result, a light emitting element including the first electrode, the first buffer layer, the light emitting layer, the second buffer layer, and the second electrode; a first connection portion including the first auxiliary wiring, the first buffer layer, the second buffer layer, and the second electrode; and a second connection portion including the second auxiliary wiring and the second electrode are formed respectively.

In the above-described structure, the present invention also includes another structure in which the first buffer layer is not formed over the first auxiliary wiring, and a light emitting element including the first electrode, the first buffer layer, the light emitting layer, the second buffer layer, and the second electrode; a first connection portion including the first auxiliary wiring, the second buffer layer, and the second electrode; and a second connection portion including the second auxiliary wiring and the second electrode are formed.

Furthermore, the present invention also includes another structure in which the second buffer layer is not formed over the first auxiliary wiring, and a light emitting element including the first electrode, the first buffer layer, the light emitting layer, the second buffer layer, and the second electrode; a first connection portion including the first auxiliary wiring, the first buffer layer, and the second electrode; and a second connection portion including the second auxiliary wiring and the second electrode are formed.

In each of the above-described structures, the first buffer layer is a layer formed of a material having a hole transporting property. In addition, as the material having a hole transporting property, a material including an organic compound and a metal compound is used. The organic compound is any one of an aromatic amine compound, a carbazole derivative, and an aromatic hydrocarbon (including an aromatic hydrocarbon containing at least one vinyl skeleton). The metal compound is any one of molybdenum oxide, vanadium oxide, ruthenium oxide, rhenium oxide, titanium oxide, chromium oxide, zirconium oxide, hafnium oxide, tantalum oxide, tungsten oxide, and silver oxide. By using a composite material formed of such an organic compound and a metal compound, the first buffer layer functions as a hole transporting layer.

Furthermore, in each of the above-described structures, the second buffer layer is a layer of an electron transporting material or a bipolar material each containing an electron donating material. In addition, the second buffer layer can be formed as a layer formed of an electron donating material. As the electron donating material, for example, an alkali metal, an alkaline earth metal, an alkali metal oxide, an alkaline earth metal oxide, an alkali metal nitride, or an alkaline earth metal nitride can be used. Since the electron transporting material or the bipolar material each containing the electron donating material, and the electron donating material each are a material having an electron transporting property, the second buffer layer can be formed as a layer formed of a material having an electron transporting property.

Furthermore, in each of the above-described structures, the first buffer layer is in contact with either one of the first electrode and the second electrode, and the second buffer layer is in contact with the other one.

By carrying out the present invention, an auxiliary wiring can be formed in the vicinity of a light emitting element. Therefore, it becomes possible to form an auxiliary wiring which is electrically connected to a second electrode not only in a peripheral portion of a light emitting display panel but also in a pixel portion having a light emitting element; therefore, variation in luminance among light emitting elements due to voltage drop of the second electrode in the pixel portion can be reduced.

BRIEF DESCRIPTION OF THE DRAWINGS

FIGS. 10A and 10B are views describing a structure of a light emitting element.

In the present invention, a layer containing a light emitting material (including a first buffer layer, a hole transporting layer, a light emitting layer, an electron transporting layer, a second buffer layer, and the like) is formed in a pixel portion, and in the case of a light emitting element according to the present invention, a second electrode and an auxiliary wiring are electrically connected even in the case where either one or both of the first buffer layer and the second buffer, layer are interposed therebetween. Therefore, it is acceptable that, only one of the hole transporting layer, the light emitting layer, and the electron transporting layer be formed so as not to overlap with a connection portion. In this way, it is not necessary to process all the layers constituting the layer containing a light emitting material into minute shapes, hence manufacturing steps can be reduced compared to the case where all the layers constituting the layer containing a light emitting material are formed so as not to overlap with the connection portion.

DETAILED DESCRIPTION OF THE INVENTION

Embodiment Modes of the present invention will be described in detail below with reference to the drawings and the like. However, the present invention can be carried out in various different modes, and it is easily understood by those skilled in the art that the modes and details can be changed in various ways without departing from the spirit and scope of the invention. Therefore, the invention is not interpreted as being limited to the following description of the Embodiment Modes.

Embodiment Mode 1

In this Embodiment Mode 1, an active matrix light emitting display panel which can be used for a light emitting device of the invention will be described, with reference to FIG. 1. In this embodiment, a light emitting element comprising a pair of electrodes is electrically connected to the TFT. One electrode of the pair of electrode (the second electrode) is not directly connected to the TFT. This second electrode is electrically connected not only to an auxiliary wiring formed in a peripheral portion but also to an auxiliary wiring formed in a pixel portion.

Figure 1:
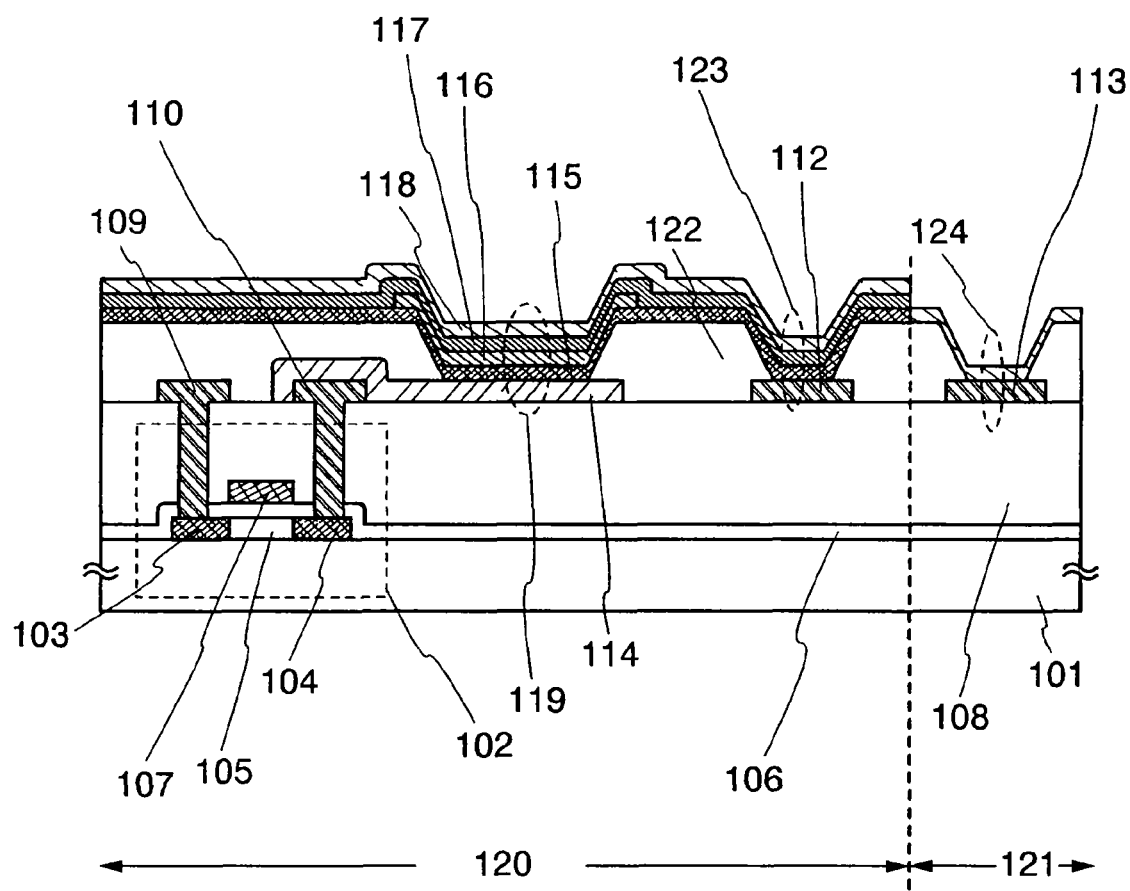
FIG. 1 is a view describing a light emitting display panel of the present invention.

In FIG. 1, in a pixel portion 120 over a substrate 101, a thin film transistor (TFT) is formed. Here, the TFT formed in the pixel portion 120 and electrically connected to a light emitting element 119 is referred to as a current controlling TFT 102.

In FIG. 1, the current controlling TFT 102 is a top gate type, which includes a source region 103, a drain region 104, a channel forming region 105, a gate electrode 107 formed thereover with a gate insulating film 106 interposed therebetween, a source electrode 109 which is electrically connected to the source region 103, and a drain electrode 110 which is electrically connected to the drain region 104.

As the substrate 101, a glass substrate, a quartz substrate, a substrate formed of an insulating material such as ceramics typified by alumina, a plastic substrate, a silicon wafer, a metal plate, or the like can be used.

The source region 103, the drain region 104, and the channel forming region 105 are formed of a semiconductor layer, and an n-type or p-type impurity (phosphorus, arsenic, boron or the like, for example) is added to the source region 103 and the drain region 104. (It is to be noted that a small amount of the above-described impurity is also added to the channel forming region 105, in some cases.) The semiconductor layer may be a crystalline semiconductor or an amorphous semiconductor. Furthermore, a semi-amorphous semiconductor or the like may be used. A thickness of the semiconductor layer is 10 to 150 nm, and preferably 30 to 70 nm.

As the crystalline semiconductor, single crystal or polycrystal silicon, or silicon germanium and the like can be given. They can be formed by laser crystallization, or crystallization by a solid phase epitaxy method using nickel or the like, for example. As the amorphous semiconductor, amorphous silicon can be given as an example.

The semi-amorphous semiconductor herein is a semiconductor having an intermediate structure between an amorphous structure and a crystalline structure (including a single crystalline and polycrystalline structures), a third state which is stable in terms of free energy, and a crystalline region having a short-range order and lattice distortion. In addition, at least part of the film includes a crystal grain having a grain diameter of 0.5 to 20 nm. The Raman spectrum shifts to the lower wavenumber side than 520 cm$^{-1}$. Diffraction peaks of (111) and (220) which are thought to be derived from Si crystalline lattice are observed by X-ray diffraction. At least 1 atomic % or more of hydrogen or halogen is contained in the semi-amorphous semiconductor in order to terminate a dangling bond. The semi-amorphous semiconductor is also referred to as a microcrystal semiconductor.

The gate insulating film 106 is formed as a single layer or a laminated layer, using a silicon oxide film, a silicon nitride film, a silicon oxynitride film, a silicon nitride oxide film, other insulating films containing silicon, or the like, and the film thickness is preferably 10 to 150 nm, more preferably 30 to 70 nm.

As the gate electrode 107, a film formed of a metal element such as Ag, Au, Cu, Ni, Pt, Pd, Ir, Rh, W, Al, Ta, Mo, Cd, Zn, Fe, Ti, Si, Ge, Zr, Ba or Nd; a film formed of an alloy material containing the above-described elements as its main component; a laminated film in which a Mo film, an Al film, and a Mo film are sequentially laminated; a laminated film in which a Ti film, an Al film, and a Ti film are sequentially laminated; a laminated film in which a MoN film, an Al film into which Nd is added, and a MoN film are sequentially laminated; a laminated film in which a Mo film, an Al film into which Nd is added, and an Mo film are sequentially laminated; a laminated film in which an Al film and a Cr film thereover are laminated; a film formed of a compound material such as a metal nitride; ITO (indium tin oxide) used as a transparent conductive film; an IZO (indium zinc oxide) film in which indium oxide is mixed with 2 to 20 [wt %] of zinc oxide (ZnO); a film of ITO having silicon oxide as a composition, or the like can be used. A film thickness of the gate electrode 107 is preferably 200 nm or more, and more preferably 300 to 500 nm.

An interlayer insulating film 108 formed over the gate electrode 107 may be formed as a single layer or a multilayer. As the interlayer insulating film 108, a film formed of an inorganic material such as silicon oxide, silicon nitride, silicon oxynitride, or silicon nitride oxide, or an organic material such as acrylic, polyimide, polyamide, or siloxane (as for siloxane, the skeleton structure is constituted by a bond between silicon (Si) and oxygen (O)) can be used.

As the source electrode 109 and the drain electrode 110 formed so as to electrically connected to the source region 103 and the drain region 104 respectively through openings formed in part of the interlayer insulating film 108, a semiconductor formed by adding a dopant to Si, Ge or a compound of Si and Ge so as to increase the conductivity; a film formed of a metal element such as Ag, Au, Cu, Ni, Pt, Pd, Ir, Rh, W, Al, Ta, Mo, Cd, Zn, Fe, Ti, Zr, or Ba; a film formed of an alloy material containing the above-described elements as its main component; a film formed of a compound material such as a metal nitride; ITO (indium tin oxide) used as a transparent conductive film; IZO (indium zinc oxide) in which indium oxide is mixed with 2 to 20 [wt %] of zinc oxide (ZnO); a film of ITO having silicon oxide as a composition, or the like can be used. A film thickness of each of the source electrode 109 and the drain electrode 110 is preferably 200 nm or more, and more preferably 300 to 500 nm.

When the source electrode 109 and the drain electrode 110 are formed, auxiliary wirings (a first auxiliary wiring 112 and a second auxiliary wiring 113) are formed simultaneously. That is, the auxiliary wirings (the first auxiliary wiring 112 and the second auxiliary wiring 113) are formed of the same material as the source electrode 109 and the drain electrode 110.

A first electrode 114 of the light emitting element 119 is formed so as to be electrically connected to the drain electrode 110 of the current controlling TFT 102. Since the first electrode 114 is formed in contact with a first buffer layer 115, even when a voltage applied to the first electrode 114 is larger than a voltage applied to a second electrode 118 (that is, a case where the first electrode 114 functions as an anode), an electrode material can be selected regardless of a value of the work function.

Therefore, as a material for the first electrode 114, ITO (indium tin oxide); ITO containing silicon oxide; IZO (indium zinc oxide) in which indium oxide is mixed with 2 to 20 [wt %] of zinc oxide (ZnO); gold (Au); platinum (Pt); titanium (Ti); nickel (Ni); tungsten (W); chromium (Cr); molybdenum (Mo); iron (Fe); cobalt (Co); copper (Cu); palladium (Pd); aluminum (Al); magnesium (Mg); a nitride of a metal material (TiN or the like, for example); an alkali metal such as Li or Cs; an alkaline earth metal such as Mg, Ca or Sr; an alloy containing such metals (Mg:Ag, Al:Li); a compound containing such metals (LiF, CsF, CaF$_2$); a transition metal containing a rare earth metal; or the like can be used.

In the invention, the first electrode 114 may be an electrode functioning as an anode or an electrode functioning as a cathode. In a case of an electrode functioning as an anode, the current controlling TFT 102 is preferably a p-channel TFT, and in a case of an electrode functioning as a cathode, the current controlling TFT 102 is preferably an n-channel TFT.

An insulator 122 is formed so as to cover end portions of the first electrode 114 and the auxiliary wirings (the first auxiliary wiring 112 and the second auxiliary wiring 113). The insulator 122 is formed by using an organic film such as acrylic, siloxane, or a resist, or an inorganic film such as a silicon oxide. The insulator 122 may be formed as a single layer using any one of these inorganic films and organic films, or may be formed as a laminated layer using both the inorganic film and the organic film.

In the pixel portion 120, the first buffer layer 115 is formed over the first electrode 114. It is to be noted that the first buffer layer 115 is formed as one continuous film without divided per pixel in the pixel portion 120, so that the first buffer layer 115 is formed also over the first auxiliary wiring 112. Although the first buffer layer 115 in FIG. 1 is shown as one continuous film without being processed into a minute shape, the first buffer layer 115 can be formed selectively in a portion where the light emitting element 119 is formed, in the same way as a light emitting layer 116 described later.

As the first buffer layer 115, a functional layer which functions as a hole transporting layer can be used. In order to form the hole transporting layer, a first composite material for a light emitting element formed of an organic compound and a metal compound can be used. As for the first composite material for a light emitting element in the invention, an aromatic amine compound, a carbazole derivative, or an aromatic hydrocarbon (including an aromatic hydrocarbon containing at least one vinyl skeleton) can be used as the organic compound. As the first composite material for a light emitting element in the Embodiment Mode 1, materials given in Embodiment Mode 7 can be used, so that the Embodiment Mode 7 is to be referred to for the specific examples, and the description is omitted here.

The light emitting layer 116 is formed over the first buffer layer 115, in a position overlapping with the first electrode 114. Unlike the first buffer layer 115, the light emitting layer 116 is not formed of one continuous film, and is formed in a predetermined region in a pixel, divided per pixel. In the invention, by forming the light emitting layer 116 into a desired shape, dividing it per pixel, the first auxiliary wiring 112 and the second electrode 118 are electrically connected sandwiching the first buffer layer 115 and a second buffer layer 117 but without sandwiching the light emitting layer 116 in a first connection portion 123.

The light emitting layer 116 contains at least one kind of light emitting material. "A light emitting material" represents a material of which the luminous efficiency is excellent and can emit light of a desired wavelength, here. The light emitting layer may be a layer formed by using only a light emitting material, or may be a layer of a material having a larger energy gap (the energy gap between a LUMO level and a HOMO level) than the energy gap of the light emitting material, in which the light emitting material is dispersed (that is, a layer containing a host material and a guest material). As the light emitting material which can be used for the light emitting layer 116 in this Embodiment Mode 1, light emitting materials given in Embodiment Mode 7 can be used, so that the Embodiment Mode 7 is to be referred to for the specific examples, and the description is omitted here.

The second buffer layer 117 is formed over the light emitting layer 116. Since the second buffer layer 117 is formed as one continuous film without being processed into a minute shape in the pixel portion 120, the second buffer layer 117 is formed also over the first buffer layer 115. Although the second buffer layer 117 in FIG. 1 is shown as one continuous film, the second buffer layer 117 can be formed in a portion where the light emitting element 119 is formed, in the same way as the light emitting layer 116.

As the second buffer layer 117, a second composite material for a light emitting element can be used. The second composite material for a light emitting element in the invention is a material in which a material selected from electron transporting materials and bipolar materials, and a material having an electron donating property (a donor) with respect to these materials are combined. As the second composite material for a light emitting element in this Embodiment Mode 1, materials given in Embodiment Mode 7 can be used, so that the Embodiment Mode 7 is to be referred to for the specific examples, and the description is omitted here.

The second electrode 118 is formed over the second buffer layer 117. Since the second electrode 118 is formed as one continuous film in the pixel portion 120 and a peripheral portion 121 without being processed into a minute shape, the second electrode 118 is formed not only over the second buffer layer 117 in the pixel portion 120 but also over the second auxiliary wiring 113 in the peripheral portion 121, thereby forming a second connection portion 124 where the second auxiliary wiring 113 and the second electrode 118 are electrically connected.

Since the second electrode 118 is formed in contact with the second buffer layer 117, even when a voltage applied to the second electrode 118 is larger than a voltage applied to the first electrode 114 (that is, a case where the second electrode 118 functions as a cathode), in the light emitting element 119, an electrode material can be selected regardless of a value of the work function. Therefore, the same materials as those given for the first electrode can be used to form the second electrode 118.

As described above, according to the invention, the second electrode and the auxiliary wiring can be electrically connected not only in the second connection portion 124 formed in the peripheral portion 121 but also in the first connection portion 123 formed in the pixel portion 120. Due to such a structure, even in the case where an area for the pixel portion is enlarged as the light emitting display panel is enlarged and the number of pixels is increased for higher definition, and when the second electrode 118 is formed in common for all the pixels, in other words, even when the second electrode is formed as one conductive layer in the pixel portion, a voltage can be applied to the second electrode 118 of a pixel which is located in a position distant from the second auxiliary wiring 113 and to the second electrode 118 of a pixel which is located in a position close to the second auxiliary wiring 113 without causing delay between the two.

The first connection portion 123 formed in the pixel portion 120 may be formed per pixel, or may be formed per a plurality of pixels.

Embodiment Mode 2

In this embodiment mode, an example structure of light emitting elements and a connection portion in a pixel portion 200 of a light emitting display panel will be described with reference to cross-sectional views of FIGS. 2A to 2C. It is to be noted that the description of the TFT (the current controlling TFT, a switching TFT or the like), the interlayer insulating film, the insulator, and the like formed in the pixel portion over the substrate as described in FIG. 1 is omitted herein, in order to simplify, the description of a structure of the light emitting element and the connection portion formed in each pixel.

Figure 2A:
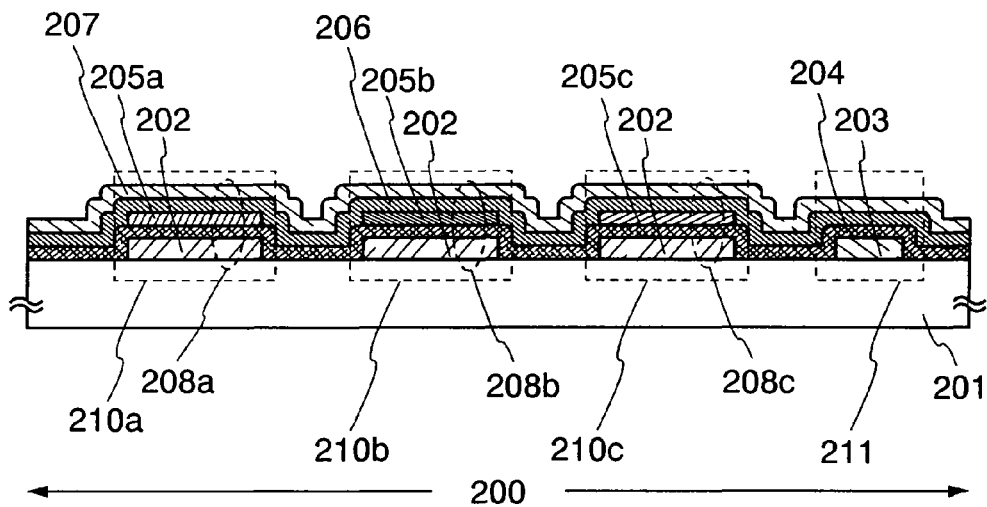
FIGS. 2A to 2C are cross-sectional views of a light emitting element and a connection portion in a pixel portion of a light emitting display panel.

As shown in FIG. 2A, a plurality of pixels (a pixel R (210a) which emits red light, a pixel G (210b) which emits green light, and a pixel B (210c) which emits blue light), and a connection portion 211 are formed over a substrate 201.

The pixel R (210a) has a light emitting element R (208a) in which a first electrode 202, a first buffer layer 204, a light emitting layer R (205a), a second buffer layer 206, and a second electrode 207 are sequentially laminated. The pixel G (210b) has a light emitting element G (208b) in which a first electrode 202, the first buffer layer 204, a light emitting layer G (205b), the second buffer layer 206, and the second electrode 207 are sequentially laminated. The pixel B (210c) has a light emitting element B (208c) in which a first electrode 202, the first buffer layer 204, a light emitting layer B (205c), the second buffer layer 206, and the second electrode 207 are sequentially laminated.

In the connection portion 211, the first buffer layer 204, the second buffer layer 206, and the second electrode 207 are sequentially laminated over an auxiliary wiring 203, and the auxiliary wiring 203 and the second electrode 207 are electrically connected via the first buffer layer 204 and the second buffer layer 206.

The first buffer layer 204, the second buffer layer 206, and the second electrode 207 are formed as continuous films in the pixel portion, without being processed into minute shapes, that is, they are formed as continuous films in a plurality of pixels (the pixel R (210a), the pixel G (210b), and the pixel B (210c)) and the connection portion 211.

It is to be noted that, although the case where the light emitting element of each pixel includes a layer containing a light emitting material, constituted by the first buffer layer 204, the light emitting layer 205, and the second buffer layer 206, interposed between a pair of electrodes is shown in FIG. 2A, a structure in which a layer 219 containing a light emitting material which is formed between a pair of electrodes (the first electrode 202 and the second electrode 207) includes a hole transporting layer 214 and an electron transporting layer 216 in addition to the first buffer layer 204, the light emitting layer 205, and the second buffer layer 206 can be adopted. In the case of separating the light emitting layer 205 per pixel and processing it into minute shapes, the case where different materials are used for the respective light emitting layers (the light emitting layer R (205a), the light emitting layer G (205b), and the light emitting layer B (205c)) is described here. However, the same material may be used for forming the light emitting layers, not limited to the above structure.

Figure 2B:
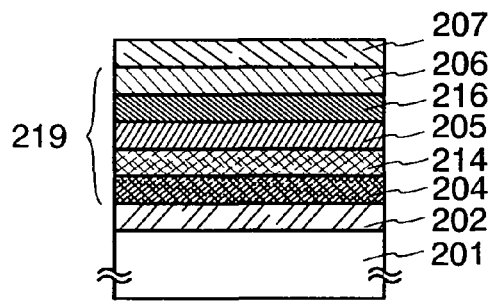
Figure 2C:
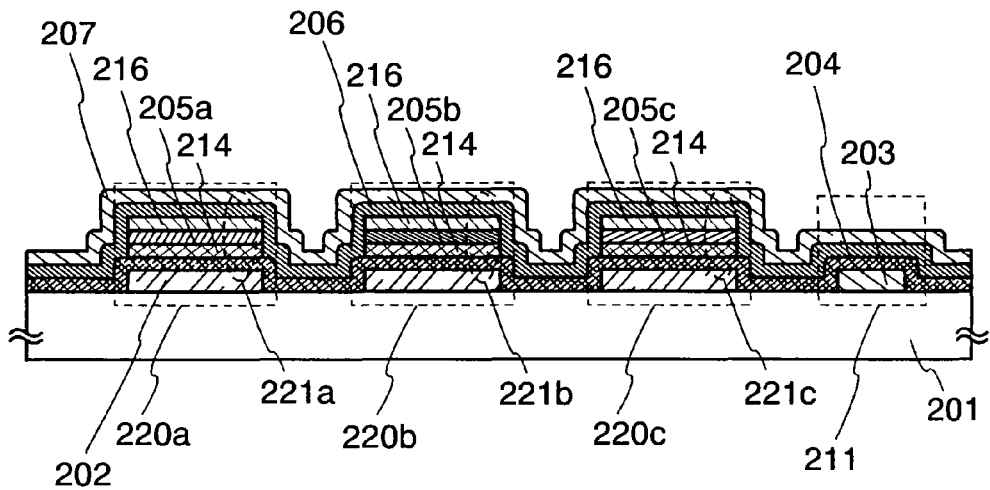

In FIG. 2C, a case where each of the light emitting elements shown in FIG. 2A has the structure of the layer containing a light emitting material shown in FIG. 2B is shown. It is to be noted that, in FIG. 2C, the same numerals and symbols are used for parts which are in common with FIGS. 2A and 2B.

That is, each of the plurality of pixels (the pixel R (220a), the pixel G (220b), and the pixel B (220c)) has the layer 219 containing a light emitting material between the first electrode 202 and the second electrode 207, and in the layer 219 containing a light emitting material, the first buffer layer 204 and the second buffer layer 206 are formed as continuous films in the pixel portion without being processed into minute shapes, in the same way as the case of FIG. 2A. In addition, the hole transporting layer 214, the light emitting layer 205 (the light emitting layer R (205a), the light emitting layer G (205b), and the light emitting layer B (205c)), and the electron transporting layer 216 are separated per light emitting element (the light emitting element R (221a), the light emitting element G (221b), and the light emitting element B (221c)) of each pixel (a pixel R (220a), a pixel G (220b), and a pixel B (220c)), and formed into desired minute shapes.

It is to be noted that, also in the case of FIG. 2C, the connection portion 211 has a structure in which only the first buffer layer 204, the second buffer layer 206, and the second electrode 207 are sequentially laminated over the auxiliary wiring 203, so that the auxiliary wiring 203 and the second electrode 207 are electrically connected via the first buffer layer 204 and the second buffer layer 206. That is, in the connection portion in the pixel portion shown in FIGS. 2A and 2C, when holes flow from the first buffer layer to the auxiliary wiring, an electric charge is generated in an interface between the first buffer layer and the second buffer layer, and electrons flow from the second buffer layer to the second electrode. The electrons which flow through the second electrode then flow into the light emitting layer, via the second buffer layer in the light emitting element of each pixel.

As materials for the layer containing a light emitting material (the first buffer layer 204, the light emitting layer 205, the second buffer layer 206, the hole transporting layer 214, and the electron transporting layer 216) described in this Embodiment Mode 2, materials given in Embodiment Mode 7 can be used, so that the Embodiment Mode 7 is to be referred to for the specific examples, and the description is omitted here.

Embodiment Mode 3

In this embodiment mode, an example structure of light emitting elements and a connection portion in a pixel portion 300 of a light emitting display panel, which is different from the Embodiment Mode 2 will be described, with reference to cross-sectional views of FIGS. 3A and 3B. It is to be noted that the description of the TFT (the current controlling TFT, a switching TFT or the like), the interlayer insulating film, the insulator, and the like formed in the pixel portion over the substrate as described in FIG. 1 is omitted herein, in order to simplify the description of a structure of the light emitting element and the connection portion formed in each pixel.

Figure 3A:
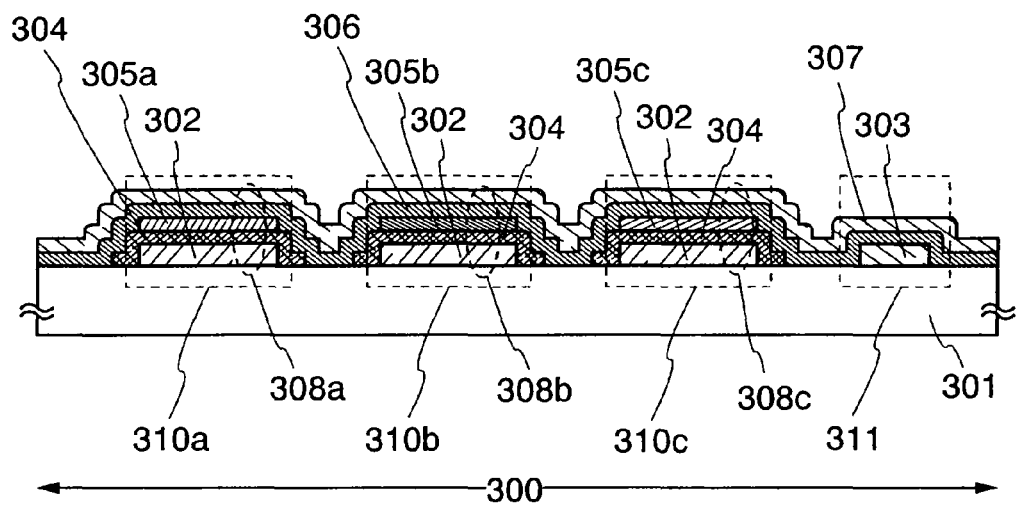
FIGS. 3A and 3B are cross-sectional views of a light emitting element and a connection portion in a pixel portion of a light emitting display panel.

As shown in FIG. 3A, a plurality of pixels (a pixel R (310a) which emits red light, a pixel G (310b) which emits green light, and a pixel B (310c) which emits blue light) and a connection portion 311 are formed over a substrate 301.

The pixel R (310a) has a light emitting element R (308a) in which a first electrode 302, a first buffer layer 304, a light emitting layer R (305a), a second buffer layer 306, and a second electrode 307 are sequentially laminated. The pixel G (310b) has a light emitting element G (308b) in which a first electrode 302, the first buffer layer 304, a light emitting layer G (305b), the second buffer layer 306, and the second electrode 307 are sequentially laminated. The pixel B (310c) has a light emitting element B (308c) in which a first electrode 302, the first buffer layer 304, a light emitting layer B (305c), the second buffer layer 306, and the second electrode 307 are sequentially laminated.

In the connection portion 311, the second buffer layer 306 and the second electrode 307 are sequentially laminated over an auxiliary wiring 303, and the auxiliary wiring 303 and the second electrode 307 are electrically connected via the second buffer layer 306.

The second buffer layer 306 and the second electrode 307 are formed as continuous films in the pixel portion, without being processed into minute shapes, that is, they are formed as continuous films in a plurality of pixels (the pixel R (310a), the pixel G (310b), and the pixel B (310c)) and the connection portion 311.

Figure 3B:
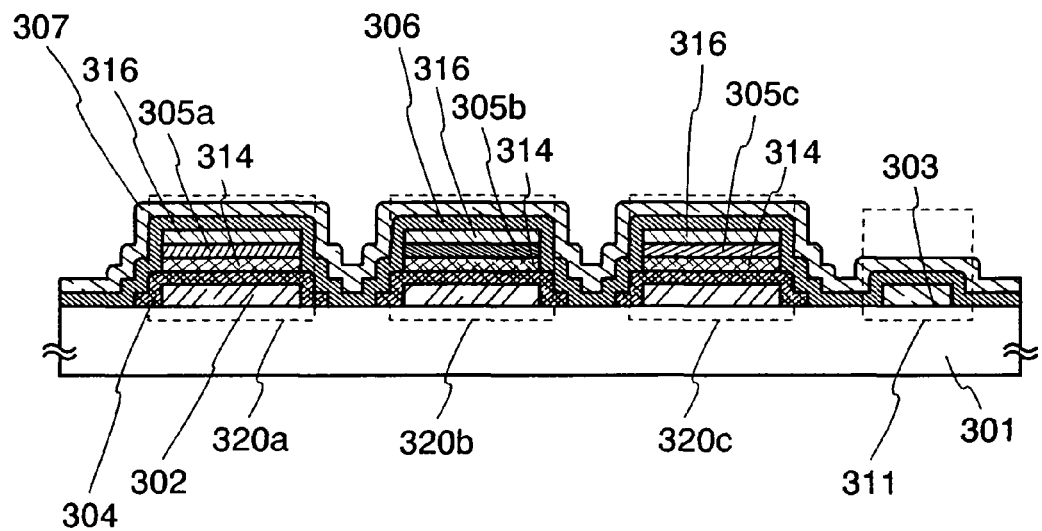

It is to be noted that, although the case where the light emitting element of each pixel includes a layer containing a light emitting material, constituted by the first buffer layer 304, the light emitting layer 305, and the second buffer layer 306, interposed between a pair of electrodes, and only the first buffer layer 304 and the light emitting layers (the light emitting layer R (305a), the light emitting layer G (305b), and the light emitting layer B (305c)) are separated per pixel and formed into desired shapes is shown in FIG. 3A, the light emitting element may have a structure shown in FIG. 3B. As shown in FIG. 3B, a layer containing a light emitting material which is formed between a pair of electrodes (the first electrode 302 and the second electrode 307) is constituted by the first buffer layer 304, a hole transporting layer 314, the light emitting layer 305, an electron transporting layer 316, and the second buffer layer 306; and the first buffer layer 304, the hole transporting layer 314, the light emitting layer 305, and the electron transporting layer 316 are formed into desired shapes. In the case of processing the light emitting layer 305 into desired minute shapes, the case where different materials are used for the respective light emitting layers (the light emitting layer R (305a), the light emitting layer G (305b), and the light emitting layer B (305c)) is described here. However, the same material may be used for forming the light emitting layers, not limited to the above structure.

In the case of FIG. 3B, the first buffer layer 304 is formed into a desired shape per light emitting element of each pixel, so that the connection portion 311 has a structure in which only the second buffer layer 306 and the second electrode 307 are sequentially laminated over the auxiliary wiring 303. Therefore, the auxiliary wiring 303 and the second electrode 307 are electrically connected via the second buffer layer 306. That is, in the connection portion in the pixel portion shown in FIGS. 3A and 3B, electrons flow from the auxiliary wiring into the second electrode via the second buffer layer. The electrons which flow through the second electrode then flow into the light emitting layer, via the second buffer layer in the light emitting element of each pixel.

As materials for the layer containing a light emitting material (the first buffer layer 304, the light emitting layer 305, the second buffer layer 306, the hole transporting layer 314, and the electron transporting layer 316) described in this Embodiment Mode 3, materials given in Embodiment Mode 7 can be used, so that the Embodiment Mode 7 is to be referred to for the specific examples, and the description is omitted here.

Embodiment Mode 4

In this embodiment mode, an example structure of light emitting elements and a connection portion in a pixel portion 400 of a light emitting display panel, which is different from the Embodiment Mode 2 or Embodiment Mode 3 will be described, with reference to cross-sectional views of FIGS. 4A and 4B. It is to be noted that the description of the TFT (the current controlling TFT, a switching TFT or the like), the interlayer insulating film, the insulator and the like formed in the pixel portion over the substrate as described in FIG. 1 is omitted herein, in order to simplify the description of a structure of the light emitting element and the connection portion formed in each pixel.

Figure 4A:
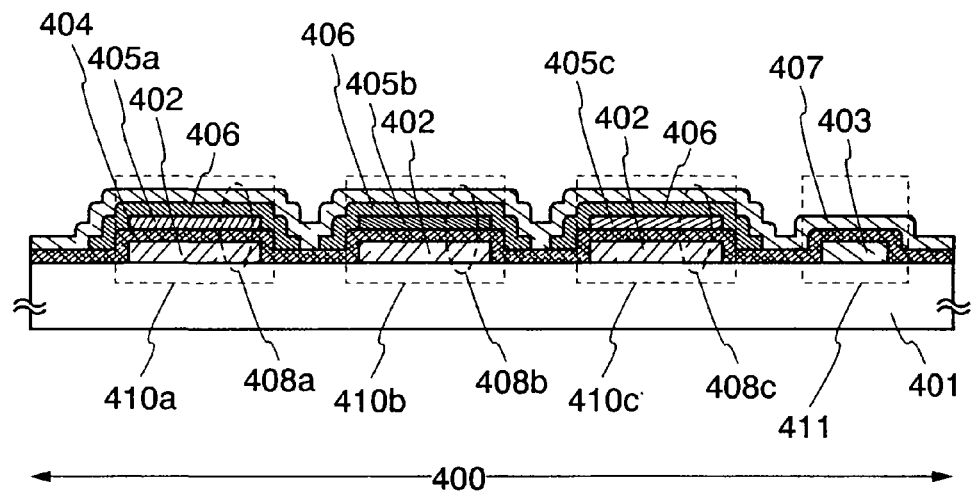
FIGS. 4A and 4B are cross-sectional views of a light emitting element and a connection portion in a pixel portion of a light emitting display panel.

As shown in FIG. 4A, a plurality of pixels (a pixel R (410a) which emits red light, a pixel G (410b) which emits green light, and a pixel B (410c) which emits blue light) and a connection portion 411 are formed over a substrate 401.

The pixel R (410a) has a light emitting element R (408a) in which a first electrode 402, a first buffer layer 404, a light emitting layer R (405a), a second buffer layer 406, and a second electrode 407 are sequentially laminated. The pixel G (410b) has a light emitting element G (408b) in which a first electrode 402, the first buffer layer 404, a light emitting layer G (405b), the second buffer layer 406, and the second electrode 407 are sequentially laminated. The pixel B (410c) has a light emitting element B (408c) in which a first electrode 402, the first buffer layer 404, a light emitting layer B (405c), the second buffer layer 406, and the second electrode 407 are sequentially laminated.

In the connection portion 411, the first buffer layer 404 and the second electrode 407 are sequentially laminated over an auxiliary wiring 403, and the auxiliary wiring 403 and the second electrode 407 are electrically connected via the first buffer layer 404.

The first buffer layer 404 and the second electrode 407 are formed as continuous films in the pixel portion, without being processed into minute shapes, that is, they are formed as continuous films in a plurality of pixels (the pixel R (410a), the pixel G (410b), and the pixel B (410c)) and the connection portion 411.

Figure 4B:
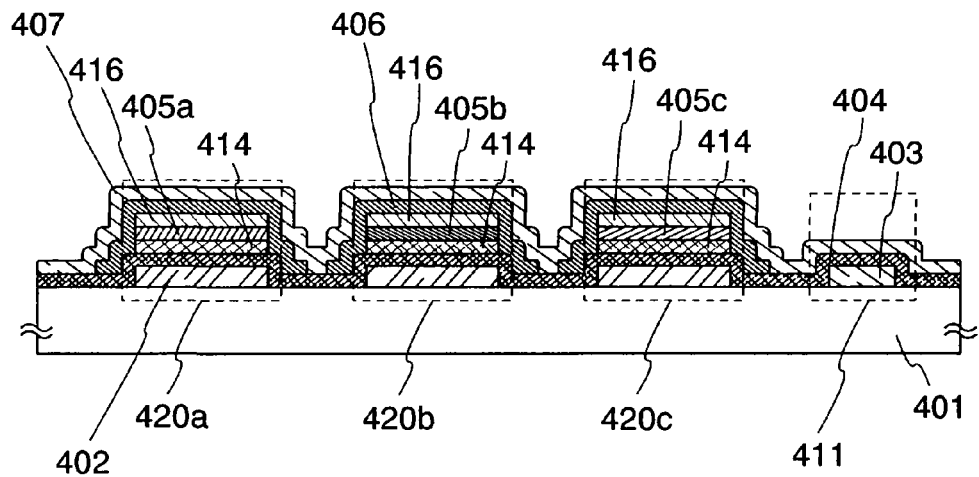

It is to be noted that, although the case where the light emitting element of each pixel includes a layer containing a light emitting material, constituted by the first buffer layer 404, the light emitting layer 405, and the second buffer layer 406, interposed between a pair of electrodes, and only the light emitting layers (the light emitting layer R (405a), the light emitting layer G (405b), and the light emitting layer B (405c)) and the second buffer layer 406 are formed into desired minute shapes is shown in FIG. 4A, a structure shown in FIG. 4B may also be adopted. As shown in FIG. 4B, a layer containing a light emitting material which is formed between a pair of electrodes (the first electrode 402 and the second electrode 407) is constituted by the first buffer layer 404, a hole transporting layer 414, the light emitting layer 405, an electron transporting layer 416, and the second buffer layer 406; and the hole transporting layer 414, the light emitting layer 405, the electron transporting layer 416, and the second buffer layer 406 are formed into desired shapes. In the case of forming the light emitting layer 405 into desired shapes, the case where different materials are used for the respective light emitting layers (the light emitting layer R (405a), the light emitting layer G (405b), and the light emitting layer B (405c)) is described here. However, the same material may be used for forming the light emitting layers, not limited to the above structure.

In the case of FIG. 4B, the second buffer layer 406 is formed into a desired shape per light emitting element of each pixel, so that the connection portion 411 has a structure in which only the first buffer layer 404 and the second electrode 407 are sequentially laminated over the auxiliary wiring 403. Therefore, the auxiliary wiring 403 and the second electrode 407 are electrically connected via the first buffer layer 404. That is, in the connection portion in the pixel portion shown in FIGS. 4A and 4B, holes flow from the first buffer layer into the auxiliary wiring, and electrons flow into the light emitting layer, via the second electrode and the second buffer layer of the pixel.

As materials for the layer containing a light emitting material (the first buffer layer 404, the light emitting layer 405, the second buffer layer 406, the hole transporting layer 414, and the electron transporting layer 416) described in this Embodiment Mode 4, materials given in Embodiment Mode 7 can be used, so that the Embodiment Mode 7 is to be referred to for the specific examples, and the description is omitted here.

Embodiment Mode 5

Figure 5A:
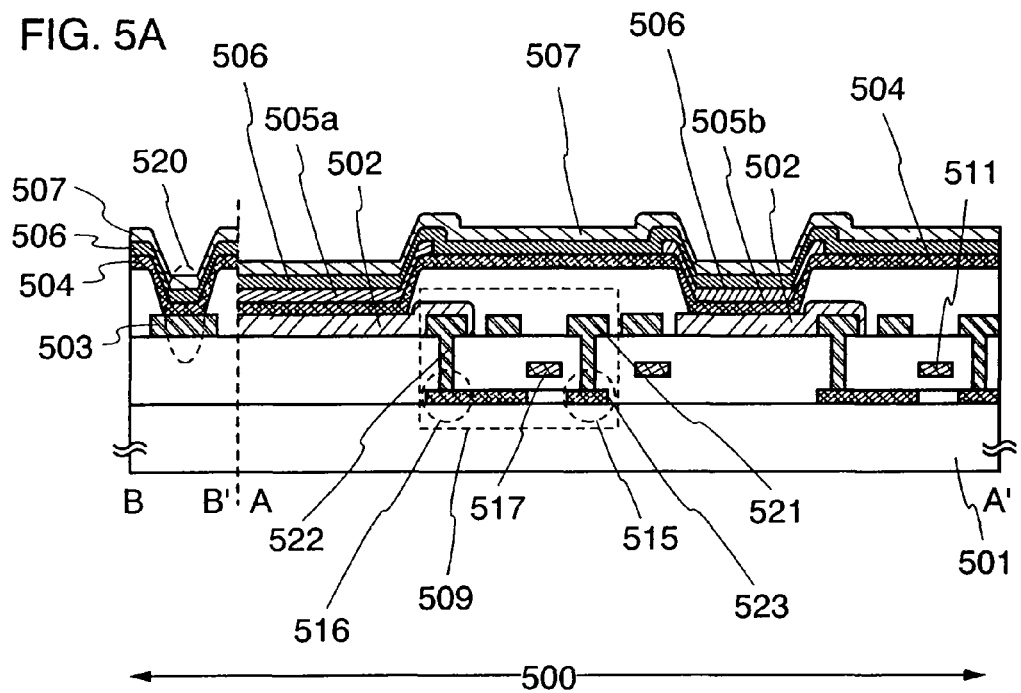
FIGS. 5A and 5B are cross-sectional views of a light emitting element and a connection portion in a pixel portion of a light emitting display panel.
Figure 5B:
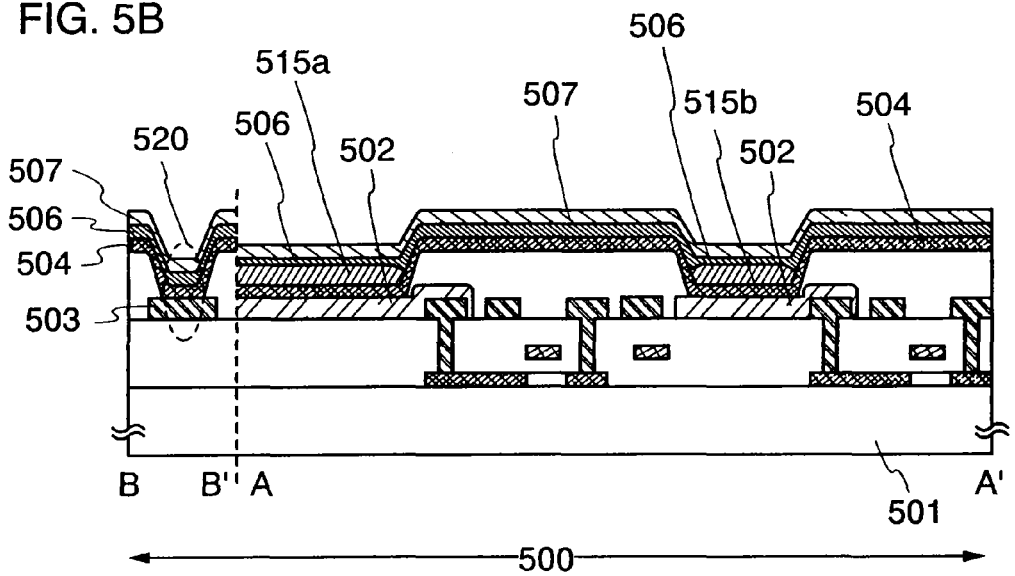
Figure 6:
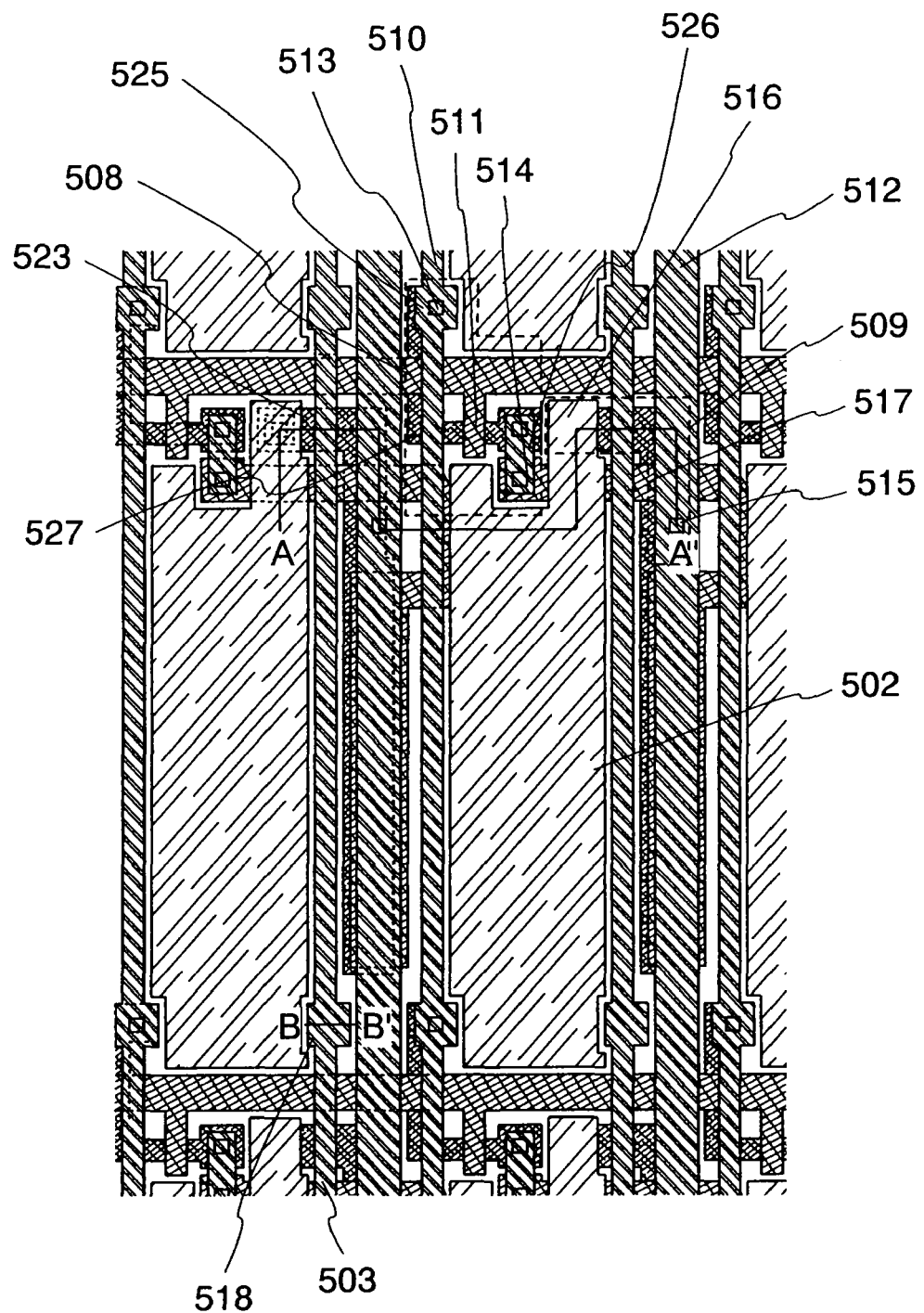
FIG. 6 is a plane view in a pixel portion of a light emitting display panel.

In this embodiment mode, an example structure of TFTs, light emitting elements, and an auxiliary wiring in a pixel portion 500 of a light emitting display panel of the invention will be described, with reference to cross-sectional views of FIGS. 5A and 5B and a plane view of FIG. 6. The plane view of FIG. 6 shows a state in which the formation is completed up to a first electrode 502, so as to make the description easier, but the cross-sectional views of FIGS. 5A and 5B are cross-sectional views at a line A-A' and a line B-B' in the plane view of FIG. 6, and each shows a state in which the formation is completed up to a second electrode 507, sequentially laminating layers over the first electrode 502. The same numerals and symbols are used for parts which are in common to FIGS. 5A and 5B, and FIG. 6.

FIG. 5A shows part of a pixel portion of the light emitting display panel, and of TFTs formed over a substrate 501 (a switching TFT 508 and a current controlling TFT 509 shown in FIG. 6), only the current controlling TFT 509 is shown.

As shown in FIG. 5A and FIG. 6, the current controlling TFT 509 is constituted by a source electrode 521 electrically connected to a current supply line 512 in a region D 515, a drain electrode 522 electrically connected to the first electrode 502 in a region E 516, a semiconductor region 523 including a source region, a drain region, and a channel forming region, and a gate electrode 517. The source electrode 521 is formed integrally with the current supply line 512.

The switching TFT 508 has a similar cross-sectional structure to the current controlling TFT 509. As shown in FIG. 6, the switching TFT 508 is constituted by a source electrode 525 electrically connected to a source signal line 510 in a region B 513, a drain electrode 526 electrically connected to a gate electrode 517 of the current controlling TFT 509 in a region C 514, a semiconductor region 527 including a source region, a drain region, and a channel forming region, and a gate electrode 511.

As shown in FIG. 6, the auxiliary wiring 503 is formed in parallel with the source signal line 510 and the current supply line 512. In a region F 518, a connection portion 520 for electrically connecting the second electrode 507 to the auxiliary wiring 503 is provided. As shown in FIG. 5A, the first buffer layer 504, the second buffer layer 506, and the second electrode 507 are sequentially laminated over the auxiliary wiring 503 in the region F 518, so as to form the connection portion 520.

In the case of FIG. 5A, the first buffer layer 504 and the second buffer layer 506 are formed as continuous films without being processed into minute shapes, and used in common for each pixel, and only the light emitting layer is separated per pixel and formed into desired shapes. However, a structure in which the first buffer layer 504 or the second buffer layer 506 is also formed into a desired shape which is separated per pixel, in the same way as the light emitting layer 505, which is shown in the Embodiment Mode 3 or 4 may be adopted.

Furthermore, although the case where the layer containing a light emitting material is constituted by the first buffer layer 504 and the light emitting layer 505 (a light emitting layer R (505a) and a light emitting layer G (505b)) is shown in FIGS. 5A and 5B of this Embodiment Mode 5, a structure in which a hole transporting layer and an electron transporting layer are also included in the layer containing a light emitting material may also be adopted, not limited to the above structure. In that case, as materials for forming these layers, materials given in Embodiment Mode 7 can be used, so that the Embodiment Mode 7 is to be referred to for the specific examples, and the description is omitted here.

Furthermore, the light emitting layer 505 (the light emitting layer R (505a) and the light emitting layer G (505b)) shown in FIG. 5A is of a case where the light emitting layer 505 is formed into a desired shape, which is separated per pixel, by a deposition method using a mask such as a metal mask (a known film forming method such as a vacuum deposition method) or the like. However, in the case of the invention, the light emitting layer 505 may be formed into a desired shape by a wet method (a known film forming method such as an ink jet method or a droplet application method) or the like as shown in FIG. 5B.

In the case of using a wet method, a solution in which a material which can be used for the light emitting layer 505 is dissolved (dispersed) in a solvent is used. As the material which can be used for the light emitting layer, a polymeric material (including a compound with moderate molecular weight such as oligomer or dendrimer in addition to polymer, in this specification) can be used, besides materials shown in Embodiment Mode 7. It is to be noted that, in the case of using a low-molecular material, a material to be a binder (hereinafter referred to as a binder material) may be included, considering the film quality when forming the film.

As the polymeric material, a polyparaphenylene vinylene derivative, a polythiophene derivative, a polyfluorene derivative, a polyparaphenylene derivative, polyalkylphenylene, a polyacetylene derivative, and the like can be given. Specifically, poly(2,5-dialkoxy-1,4-phenylene vinylene): RO-PPV; poly(2-dialkoxyphenyl-1,4-phenylene vinylene): ROPh-PPV; poly(2-methoxy-5-(2-ethyl-hexoxy)-1,4-phenylene vinylene): MEH-PPV; poly(2,5-dimethyloctylsilyl-1,4-phenylene vinylene): DMOS-PPV; poly(2,5-dialkoxy-1,4-phenylene): RO-PPP; poly(3-alkylthiophene): PAT; poly(3-hexylthiophene): PHT; poly(3-cyclohexylthiophene): PCHT; poly(3-cyclohexyl-4-methylthiophene): PCHMT; poly(3-[4-octylphenyl]-2,2'-bithiophene): PTOPT; poly(3-(4-octylphenyl)-thiophene): POPT-1; poly(dialkylfluorene): PDAF; poly(dioctylfluorene): PDOF; polypropylphenylacetylene: PPA-iPr; polybutylphenylphenylacetylene: PDPA-nBu; polyhexylphenylacetylene: PHPA, and the like are given.

In addition, as a typical solvent used for such materials, toluene, benzene, chlorobenzene, dichlorobenzene, chloroform, tetralin, xylene, anisole, dichloromethane, γ-butyl lactone, butyl cellsolve, cyclohexane, NMP (N-methyl-2-pyrrolidone), dimethyl sulfoxide, cyclohexanone, dioxane, THF (tetrahydrofuran), and the like are given.

In addition, as the binder material, polyvinyl alcohol, polymethylmethacrylate, polycarbonate, a phenol resin or the like can be used.

Embodiment Mode 6

Figure 7A:
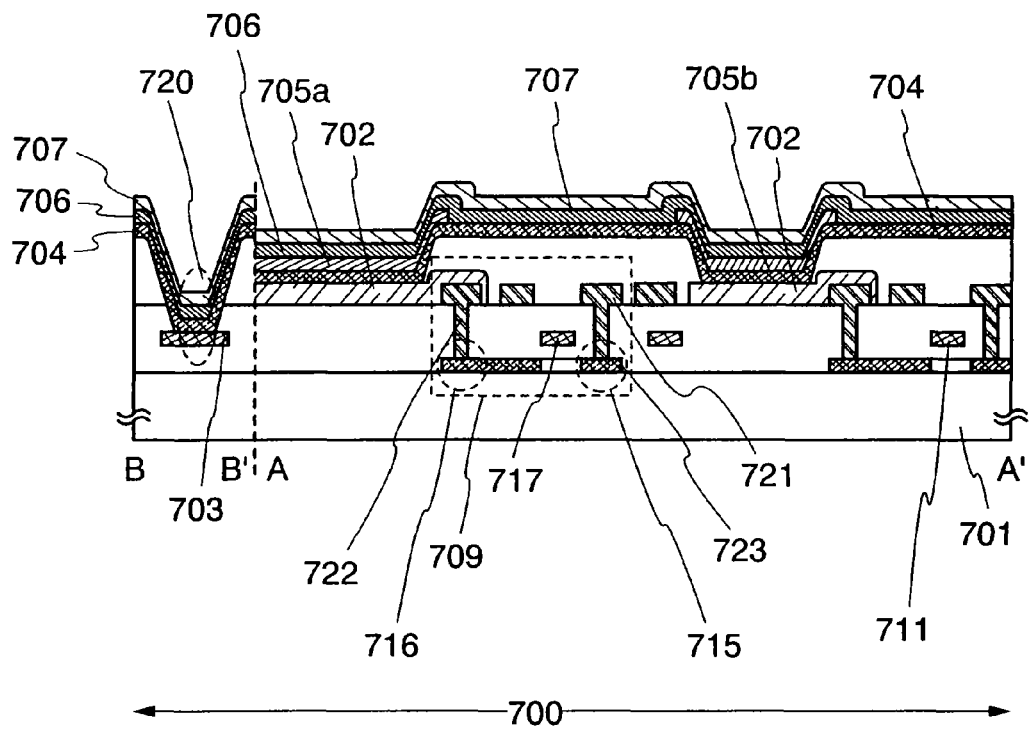
FIGS. 7A and 7B are cross-sectional views of a light emitting element and a connection portion in a pixel portion of a light emitting display panel.
Figure 7B:
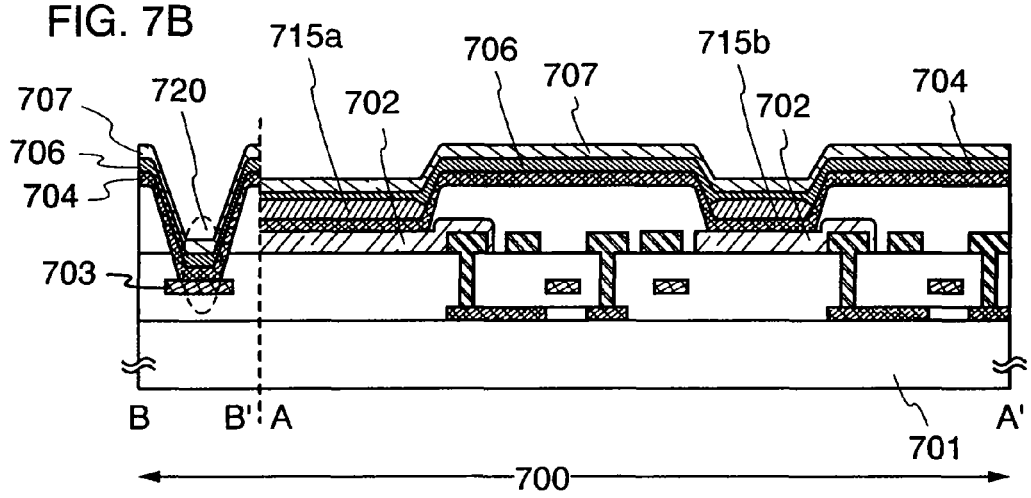
Figure 8:
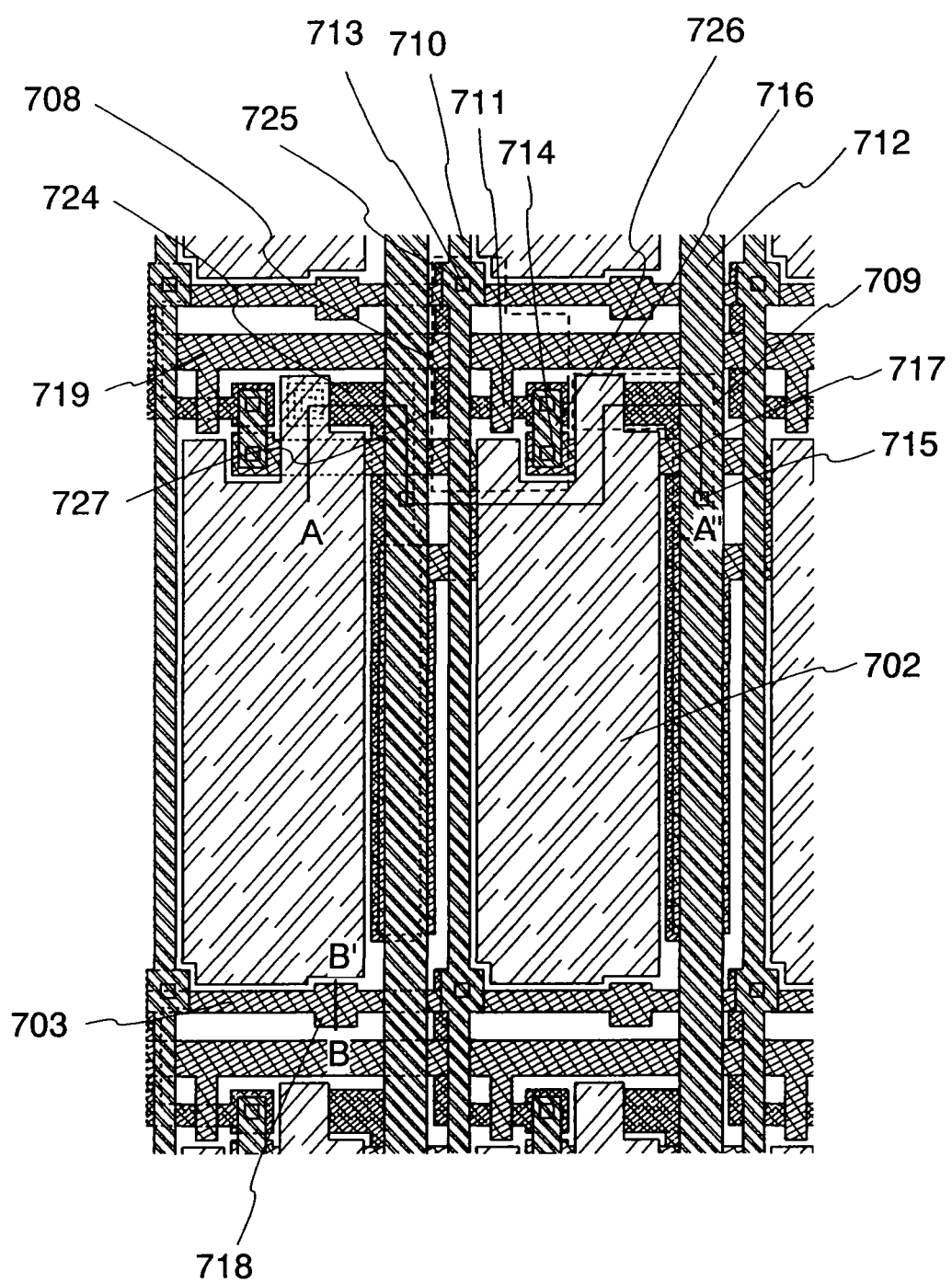
FIG. 8 is a plane view in a pixel portion of a light emitting display panel.

In this embodiment mode, an example structure of TFTs, light emitting elements, and an auxiliary wiring in a pixel portion 700 of a light emitting display panel, which is different from the Embodiment Mode 5 will be described, with reference to cross-sectional views of FIGS. 7A and 7B and a plane view of FIG. 8. The plane view of FIG. 8 shows a state in which the formation is completed up to a first electrode 702, so as to make the description easier, but the cross-sectional views of FIGS. 7A and 7B are cross-sectional views at a line A-A' and a line B-B' in the plane view of FIG. 8, and each shows a state in which the formation is completed up to a second electrode 707, sequentially laminating layers over the first electrode 702. The same numerals and symbols are used for parts which are in common to FIGS. 7A and 7B, and FIG. 8.

FIG. 7A shows part of a pixel portion of the light emitting display panel, and of TFTs formed over a substrate 701 (a switching TFT 708 and a current controlling TFT 709 shown in FIG. 8), only the current controlling TFT 709 is shown.

As shown in FIG. 8, the current controlling TFT 709 is constituted by a source electrode electrically connected to a current supply line 712 in a region D 715, a drain electrode electrically connected to the first electrode 702 in a region E 716, a semiconductor region including a source region, a drain region, and a channel forming region, and a gate electrode 717.

The switching TFT 708 has a similar cross-sectional structure to the current controlling TFT 709, and is constituted by a source electrode 725 electrically connected to a source signal line 710 in a region B 713, a drain electrode 726 electrically connected to a gate electrode 717 of the current controlling TFT 709 in a region C 714, a semiconductor region 727 including a source region, a drain region, and a channel forming region, and a gate electrode 711, as shown in FIG. 8. The source electrode 725 is formed integrally with the source signal line 710.

In addition, an auxiliary wiring 703 is formed in parallel with a gate signal line 719, as shown in FIG. 8. In a region F 718, a connection portion 720 for electrically connecting the second electrode 707 to the auxiliary wiring 703 is formed. As shown in FIG. 7A, a first buffer layer 704, a second buffer layer 706, and the second electrode 707 are sequentially laminated over the auxiliary wiring 703 in the region F 718, so as to form the connection portion 720.

In the case of FIG. 7A, the first buffer layer 704 and the second buffer layer 706 are formed as continuous films without being processed into minute shapes, and used in common for each pixel, and only the light emitting layer is separated per pixel and formed into desired shapes. However, a structure in which the first buffer layer 704 or the second buffer layer 706 is also formed into a desired minute shape which is separated per pixel, in the same way as the light emitting layer, which is shown in the Embodiment Mode 3 or 4 may be adopted.

Furthermore, although the case where the layer containing a light emitting material is constituted by the first buffer layer 704 and the light emitting layer 705 (a light emitting layer R (705*a*) and a light emitting layer G (705*b*)) is shown in FIGS. 7A and 7B of this Embodiment Mode 6, a structure in which a hole transporting layer and an electron transporting layer are also included in the layer containing a light emitting material may be adopted, not limited to the above structure. In that case, as materials for forming these layers, materials given in Embodiment Mode 7 can be used, so that the Embodiment Mode 7 is to be referred to for the specific examples, and the description is omitted here.

Furthermore, the light emitting layer 705 (the light emitting layer R (705*a*) and the light emitting layer G (705*b*)) shown in FIG. 7A is of a case where the light emitting layer 705 is formed into a desired shape, which is separated per pixel, by a deposition method using a mask such as a metal mask (a known film forming method such as a vacuum deposition method) or the like. However, in the case of the invention, the light emitting layer 705 may be formed into a desired shape by a wet method (a known film forming method such as an ink-jet method or a droplet application method) or the like as shown in FIG. 7B.

As a material used for forming the light emitting layer 705 by using a wet method, the materials shown in the Embodiment Mode 5 can be used, and the description is omitted here.

Embodiment Mode 7

In this embodiment mode, a structure of a light emitting element which can be applied in the invention will be described with reference to FIGS. 9A to 9F. That is, the structure of a light emitting element described in this embodiment mode can be applied to a light emitting element portion in other embodiment modes. In any case of FIGS. 9A to 9F, a light emitting element formed over a substrate 901 has a structure in which a first electrode 902, a layer 903 containing a light emitting material, and a second electrode 904 are sequentially laminated. In addition, in the case of FIGS. 9A to 9F shown in this embodiment mode, even when a thin film transistor is formed over the substrate, it is regarded as being included in the substrate 901 and the description will be omitted. Furthermore, in this embodiment mode, the first electrode 902 functions as an anode, and the second electrode 904 functions as a cathode.

Figure 9A:
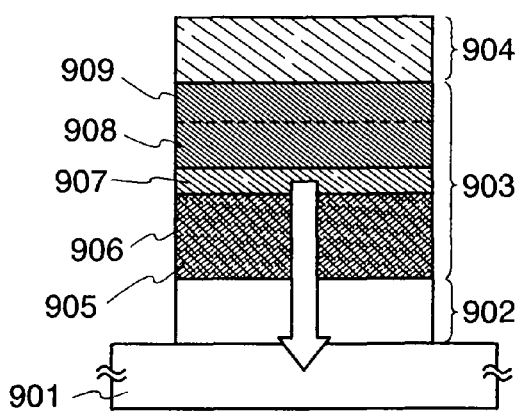
FIGS. 9A to 9F are views each describing a light emitting display panel of the present invention.

In the case of FIG. 9A, the first electrode 902 is formed of a transparent conductive film, the second electrode 904 is formed of a light-blocking (reflective) conductive film, and light generated in a light emitting layer 907 is emitted from the first electrode 902 side (in a direction of an arrow in the view). In this case, the layer 903 containing a light emitting material has a structure in which a first buffer layer 905, the light emitting layer 907, and a second buffer layer 909 are sequentially laminated from the first electrode 902 side. A hole transporting layer 906 may be provided between the first buffer layer 905 and the light emitting layer 907, as shown in FIG. 9A. Furthermore, an electron transporting layer 908 may be provided between the light emitting layer 907 and the second buffer layer 909.

As a material for forming the first electrode 902, a conductive material having a light-transmitting property is preferably used. The material having a light-transmitting property is a film to which transmission factor of visible light is 40% or more, and of which the resistivity is $1 \times 10^{-2}$ Ωcm or less.

As a specific example of a material for forming the first electrode 902, indium tin oxide (ITO), ITO containing silicon oxide, indium zinc oxide (IZO) in which 2 to 20 [wt %] of zinc oxide (ZnO) is mixed in indium oxide, or the like can be used.

Furthermore, in a case of using a thin film with a thickness of 100 nm or less for ensuring a light-transmitting property required for the first electrode 902, gold (Au), platinum (Pt), titanium (Ti), nickel (Ni), tungsten (W), chromium (Cr), molybdenum (Mo), iron (Fe), cobalt (Co), copper (Cu), palladium (Pd), or a nitride of a metal material such as titanium nitride (TiN), aluminum (Al), silver (Ag), an alkali metal, an alkaline earth metal such as magnesium (Mg), an alloy of such metals (Mg:Ag, Al:Li) or the like can be used.

In the case of FIG. 9A, since the first buffer layer 905 is provided in contact with the first electrode 902, aluminum (Al), silver (Ag), an alkali metal, an alkaline earth metal such as magnesium (Mg), an alloy containing such metals (Mg: Ag, Al:Li) and the like, which are generally known as materials with a small work function, can be used. This is because an ohmic contact with respect to electrode materials having a wide range of work functions becomes possible by providing the first buffer layer 905.

As a material for forming the second electrode 904, a conductive material having a light-blocking property (reflectivity) is preferably used. The conductive material having a light-blocking property is a film to which transmission factor of visible light is less than 10%, and of which the resistivity is $1 \times 10^{-2}$ Ωm or less. In addition, the material having reflectivity is a film to which reflection factor of visible light is 40% to 100%, preferably 70% to 100%, and of which the resistivity is $1 \times 10^{-2}$ Ωcm or less.

As a specific example of a material for forming the second electrode 904, gold (Au), platinum (Pt), titanium (Ti), nickel (Ni), tungsten (W), chromium (Cr), molybdenum (Mo), iron (Fe), cobalt (Co), copper (Cu), palladium (Pd), or a nitride of a metal material such as titanium nitride (TiN), aluminum (Al), silver (Ag), an alkali metal, an alkaline earth metal such as magnesium. (Mg), an alloy including such metals (Mg:Ag, Al:Li) or the like can be given.

Furthermore, in order to ensure the light-blocking property (reflectivity) required for the second electrode 904, a light-transmitting material and a material having a light-blocking property (reflectivity) can be used in combination. As the light transmitting material, ITO, ITO containing silicon oxide, IZO or the like can be used.

In the case of FIG. 9A, since the second buffer layer 909 is provided in contact with the second electrode 904, ITO, ITO containing silicon oxide, IZO and the like, which are generally known as materials with a large work function, can be used. This is because an ohmic contact with respect to electrode materials having a wide range of work functions becomes possible by providing the second buffer layer 909.

For the first buffer layer 905, a first composite material for a light emitting element can be used, as a material having a hole transporting property. In the invention, the first composite material for a light emitting element is constituted by a combination of a metal compound and any one of an aromatic amine compound, a carbazole derivative, and an aromatic hydrocarbon (including an aromatic hydrocarbon which includes at least one vinyl skeleton).

As the aromatic amine compound, 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-{4-(N,N-di-m-tolylamino)phenyl}-N-phenylamino] biphenyl (abbreviation: DNTPD), 1,3,5-tris[N,N-di(m-tolyl)amino]benzene (abbreviation: m-MTDAB), 4,4',4''-tris(N-carbazolyl)triphenylamine (abbreviation: TCTA); 2,3-bis(4-diphenylaminophenyl)quinoxaline (abbreviation: TPAQn); 2,2',3,3'-tetrakis(4-diphenylaminophenyl)-6,6'-bisquinoxaline (abbreviation: D-TriPhAQn); 2,3-bis{4-[N-(1-naphthyl)-N-phenylamino]phenyl}-dibenzo[f,h]quinoxaline (abbreviation: NPADiBzQn); and the like can be given.

As the carbazole derivative, materials represented by the following general formula (1) can be used. As the specific examples, 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and the like can be given. A composite material for a light emitting element using a carbazole derivative having this structure is superior in heat stability and has preferable reliability.

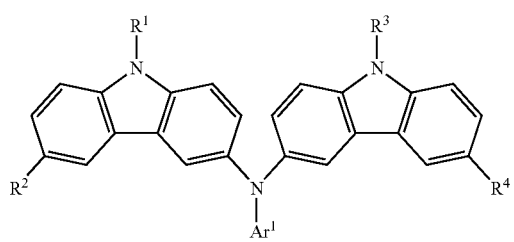

(1)

(In the general formula (1), R¹ and R³ may be identical to or different from each other, and independently represent any of hydrogen, an alkyl group having 1 to 6 carbon atoms, an aryl group having 6 to 25 carbon atoms, a heteroaryl group having 5 to 9 carbon atoms, an arylalkyl group, and an acyl group having. 1 to 7 carbon atoms. Ar¹ represents either an aryl group having 6 to 25 carbon atoms or a heteroaryl group having 5 to 9 carbon atoms. R² represents any of hydrogen, an alkyl group having 1 to 6 carbon atoms, and an aryl group having 6 to 12 carbon atoms. R⁴ represents any of hydrogen, an alkyl group having 1 to 6 carbon atoms, an aryl group having 6 to 12 carbon atoms, and a substituent represented by the general formula (2). In the substituent represented by the general formula (2), R⁵ represents any of hydrogen, an alkyl group having 1 to 6 carbon atoms, an aryl group having 6 to 25 carbon atoms, a heteroaryl group having 5 to 9 carbon atoms, an arylalkyl group, and an acyl group having 1 to 7 carbon atoms. Ar² represents either an aryl group having 6 to 25 carbon atoms or a heteroaryl group having 5 to 9 carbon atoms. R⁶ represents any of hydrogen, an alkyl group having 1 to 6 carbon atoms, and an aryl group having 6 to 12 carbon atoms.)

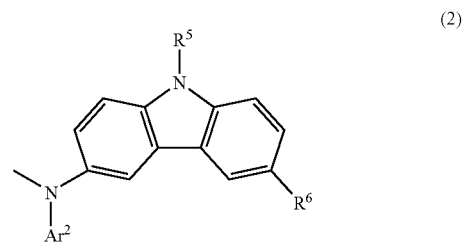

(2)

Furthermore, a carbazole derivative represented by any one of the following general formulas (3) to (6) can be used. As specific examples of a carbazole derivative represented by any one of the following general formulas (3) to (6), N-(2-naphthyl)carbazole (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); 1,3,5-tris[4-(N-carbazolyl)phenyl]benzene (abbreviation: TCPB); and the like can be given.

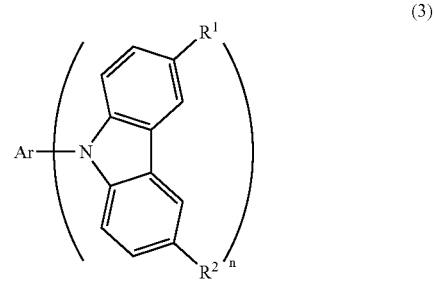

(3)

In the general formula (3), Ar represents an aromatic hydrocarbon group having 6 to 42 carbon atoms, n represents a natural number of 1 to 3, and R¹ and R² independently represent any of hydrogen, an alkyl group having 1 to 4 carbon atoms, and an aryl group having 6 to 12 carbon atoms.

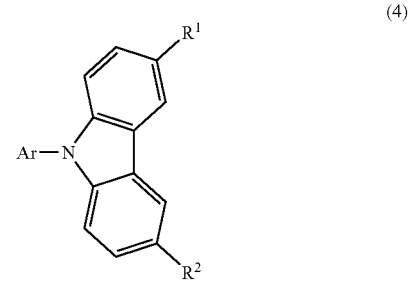

(4)

In the general formula (4), Ar represents a univalent aromatic hydrocarbon group having 6 to 42 carbon atoms, and $R^1$ and $R^2$ independently represent any of hydrogen, an alkyl group having 1 to 4 carbon atoms, and an aryl group having 6 to 12 carbon atoms.

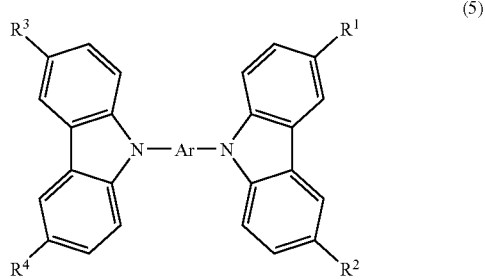

(5)

In the general formula (5), Ar represents a bivalent aromatic hydrocarbon group having 6 to 42 carbon atoms, and $R^1$ to $R^4$ independently represent any of hydrogen, an alkyl group having 1 to 4 carbon atoms, and an aryl group having 6 to 12 carbon atoms.

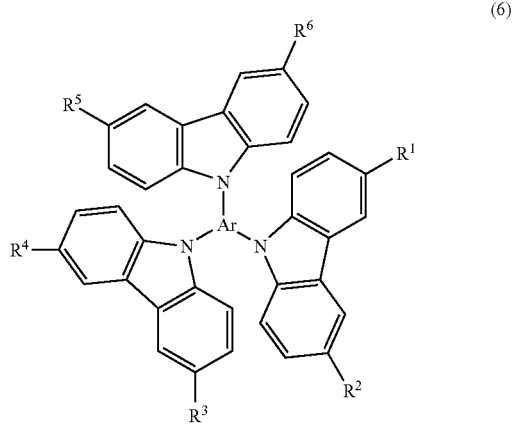

(6)

In the general formula (6), Ar represents a trivalent aromatic hydrocarbon group having 6 to 42 carbon atoms, and $R^1$ to $R^6$ independently represent any of hydrogen, an alkyl group having 1 to 4 carbon atoms, and an aryl group having 6 to 12 carbon atoms.

As the aromatic hydrocarbon (including an aromatic hydrocarbon including at least one vinyl skeleton), aromatic hydrocarbons such as anthracene, 9,10-diphenylanthracene (abbreviation: DPA), 2-tert-butyl-9,10-di(2-naphthyl)anthracene (abbreviation: t-BuDNA); tetracene, rubrene, and pentacene can be given.

As the above-described metal compound, an oxide or nitride of a transition metal is preferable, and an oxide or nitride of a metal which belongs to Group 4 to 8 is more preferable. In addition, a material having an electron-accepting property with respect to any of the above-described aromatic amines, carbazole derivatives, and aromatic hydrocarbons (including aromatic hydrocarbons including at least one vinyl skeleton) is preferable. As a metal compound having such properties, for example, molybdenum oxide, vanadium oxide, ruthenium oxide, rhenium oxide or the like can be given. Besides them, a metal compound such as titanium oxide, chromium oxide, zirconium oxide, hafnium oxide, tantalum oxide, tungsten oxide, or silver oxide can be used.

In the first buffer layer 905, the metal compound is preferably contained in an aromatic amine, a carbazole derivative, or an aromatic hydrocarbon (including an aromatic hydrocarbon including at least one vinyl skeleton) so that mass ratio is 0.5 to 2 with respect to these, or molar ratio is 1 to 4 (=metal compound/aromatic hydrocarbon), in a case of using any of the above. In this way, by mixing the metal compound with any of an aromatic amine, a carbazole derivative, or an aromatic hydrocarbon (including an aromatic hydrocarbon including at least one vinyl 20 skeleton) in the first buffer layer 905, crystallization of these materials which are easily crystallized can be suppressed.

Furthermore, of the above-described metal compounds, especially molybdenum oxide is easily crystallized when it forms a layer by itself; however, by combining with any of an aromatic amine, a carbazole derivative, and an aromatic hydrocarbon (including an aromatic hydrocarbon including at least one vinyl skeleton), the crystallization can be suppressed. In this way, the first buffer layer 905 is a layer which is not easily crystallized, since a plurality of materials which are mixed prevent crystallization of one another. The first buffer layer 905 can have a film thickness of 50 nm or more, due to its high conductivity.

The light emitting layer 907 includes at least one kind of light emitting material. A light emitting material herein represents a material with good light-emitting efficiency which can emit light of a desired wavelength. The light emitting layer may be a layer formed by using only a light emitting material, or may be a layer formed of a material having a larger energy gap (the energy gap between a LUMO level and a HOMO level) than the energy gap of the light emitting material, in which the light emitting material is dispersed (that is, a layer containing a host material and a guest material). It is to be noted that light emission can be prevented from being quenched due to concentration by dispersing a light emitting material which functions as a guest (also referred to as a guest material) in a light emitting material which functions as a host (also referred to as a host material) in the light emitting layer.

As a specific light emitting material used for the light emitting layer 907, the following various light emitting materials are effective: tris(8-quinolinolato)aluminum (hereinafter, referred to as $Alq_3$); tris(4-methyl-8-quinolinolato)aluminum (hereinafter, referred to as $Almq_3$); bis(10-hydroxybenzo[h]-quinolinato)beryllium (hereinafter, referred to as $BeBq_2$); bis(2-methyl-8-quinolinolato)(4-phenylphenolato)aluminum (hereinafter, referred to as BAlq); bis[2-(2'-hydroxyphenyl)-benzoxazolato]zinc (hereinafter, referred to as $Zn(BOX)_2$); bis[2-(2'-hydroxyphenyl)-benzothiazolato]zinc (hereinafter, referred to as $Zn(BTZ)_2$); 4-(dicyanomethylene)-2-isopropyl-6-[2-(1,1,7,7-tetramethyljulolidin-9-yl)ethenyl]-4H-pyran (hereinafter, referred to as DCJTI); 4-(dicyanomethylene)-2-methyl-6-[2-(1,1,7,7-tetramethyljulolidin-9-yl)ethenyl]-4H-pyran (hereinafter, referred to as DCJT); 4-(dicyanomethylene)-2-tert-butyl-6-[2-(1,1,7,7-tetramethyljulolidin-9-yl)ethenyl]-4H-pyran (hereinafter, referred to as DCJTB); periflanthene; 1,4-bis[2-(10-methoxy-1,1,7,7-tetramethyljulolidin-9-yl)ethenyl]-2,5-dicyanobenzene; N,N'-dimethylquinacridone (hereinafter, referred to as DMQd); coumarin 6; coumarin 545T; 9,10-di (2-naphthyl)-2-tert-butylanthracene (hereinafter, referred to as t-BuDNA); 9,9'-bianthryl; 9,10-diphenylanthracene (hereinafter, referred to as DPA); 9,10-di(2-naphthyl)anthracene (hereinafter, referred to as DNA); bis(2-methyl-8-quinolinolato)-4-phenylphenolato-gallium (hereinafter, referred to as BGaq); bis(2-methyl-8-quinolinolato)(4-phenylphenolato) aluminum (hereinafter, referred to as BAlq); tris(2-phenylpyridinato-N,C$^{2'}$)iridium (hereinafter, referred to as Ir(ppy)$_3$); (2,3,7,8,12,13,17,18-octaethyl-21H,23H-porphyrinato) platinum (hereinafter, referred to as PtOEP); bis{2-[3',5'-bis (trifluoromethyl)phenyl)pyridinato-N,C$^{2'}$]iridium(111)picolinate (hereinafter, referred to as Ir(CF$_3$ppy)$_2$(pic)); bis[2-(4',6'-difluorophenyl)pyridinato-N,C$^{2'}$]iridium(111) acetylacetonate (hereinafter, referred to as Flr(acac)); bis[2-(4',6'-difluorophenyl)pyridinato-N,C$^{2'}$]iridium(111) picolinate (hereinafter, referred to as Flr(pic)); and the like.

In a case where the light emitting layer is formed by combining a host material and a guest material, the light emitting layer may be formed by combining the light emitting material described above and a host material which will be described hereinafter.

As a specific host material, the following can be used: tris(8-quinolinolato)aluminum (hereinafter, referred to as Alq$_3$); tris(4-methyl-8-quinolinolato)aluminum (hereinafter, referred to as Almq$_3$); bis(10-hydroxybenzo[h]-quinolinato) beryllium (hereinafter, referred to as BeBq$_2$); bis(2-methyl-8-quinolinolato)(4-phenylphenolato)aluminum (hereinafter, referred to as BAlq); bis[2-(2'-hydroxyphenyl)-benzoxazolato]zinc (hereinafter, referred to as Zn(BOX)$_2$); bis[2-(2'-hydroxyphenyl)-benzothiazolato]zinc (hereinafter, referred to as Zn(BTZ)$_2$); 9,10-di(2-naphthyl)-2-tert-butylanthracene (hereinafter, referred to as t-BuDNA); 9,10-di(2-naphthyl) anthracene (hereinafter, referred to as DNA); bis(2-methyl-8-quinolinolato)-4-phenylphenolato-gallium (hereinafter, referred to as BGaq); 4,4'-di(N-carbazolyl)biphenyl (hereinafter, referred to as CBP); 4,4',4"-tris(N-carbazolyl)triphenylamine (hereinafter, referred to as TCTA); 2,2',2"-(1,3,5-benzenetriyl)-tris(1-phenyl-1H-benzimidazole) (hereinafter, referred to as TPBi); TPAQn; and the like.

Furthermore, for the second buffer layer 909, a second composite material for a light emitting element can be used. The second composite material for a light emitting element of the invention is constituted by a combination of at least one material selected from electron transporting materials and bipolar materials, and a material having an electron-donating property with respect to these materials (donor). As the electron transporting material and the bipolar material, a material having an electron mobility of $1 \times 10^{-6}$ cm$^2$/Vs or more is preferable.

As the electron transporting material and the bipolar material, materials which will be given in the later description of an electron transporting layer 908 can be used. Furthermore, it is preferable to select a material which has higher electron affinity than a material used for forming the electron transporting layer 908, from the electron transporting materials and the bipolar materials.

As a material having an electron-donating property (donor), a material selected from alkali metals and alkaline earth metals: specifically an alkali metal or an alkaline earth metal such as lithium (Li), calcium (Ca), sodium (Na), potassium (K), or magnesium (Mg) can be used. In addition, an alkali metal oxide, an alkaline earth metal oxide, an alkali metal nitride, an alkaline earth metal nitride, specifically lithium oxide (Li$_2$O), calcium oxide (CaO), sodium oxide (Na$_2$O), potassium oxide (K$_2$O), magnesium oxide (MgO), lithium fluoride (LiF), cesium fluoride (CsF), calcium fluoride (CaF$_2$) or the like may be used as a material having an electron donating property.

The second buffer layer 909 may be formed of only the material having an electron-donating property (donor) described above.

The hole transporting layer 906 is a layer superior in a hole transporting property, and specifically, the hole transporting layer 906 is preferably formed of a hole transporting material or a bipolar material, which has hole mobility of $1 \times 10^{-6}$ cm$^2$/Vs or more. The hole transporting material is a material having higher hole mobility than electron mobility, and preferably, a material having a value of a ratio of the hole mobility to the electron mobility (=hole mobility/electron mobility) of more than 100.

As the hole transporting material, for example, an aromatic amine-based (namely a substance having a bond of benzene ring-nitrogen) compound is preferable. As a substance which is widely used, for example, N,N'-diphenyl-N,N'-bis(3-methylphenyl)-1,1'-biphenyl-4,4'-diamine (hereinafter, referred to as TPD); 4,4'-bis[N-(1-naphtyl)-N-phenyl-amino]biphenyl (hereinafter, referred to as NPB) which is a derivative thereof; a star burst aromatic amine compound such as 4,4', 4"-tris(N-carbazolyl)-triphenylamine (hereinafter, referred to as TCTA), 4,4',4"-tris(N,N-diphenylamino)triphenylamine (hereinafter, referred to as TDATA), or 4,4',4"-tris[N-(3-methylphenyl)-N-phenylamino]triphenylamine (hereinafter, referred to as MTDATA) is given.

The bipolar material is a material which is described as follows: when mobility of an electron and mobility of a hole are compared with each other, a value of a ratio of mobility of one carrier to mobility of the other carrier is 100 or less, preferably 10 or less. As the bipolar material, for example, 2,3-bis(4-diphenylaminophenyl)quinoxaline (abbreviation: TPAQn); 2,3-bis{4-[N-(1-naphthyl)-N-phenylamino]phenyl}-dibenzo[f,h]quinoxaline (abbreviation: NPADiBzQn); and the like are given. In particular, among bipolar materials, a material having hole mobility and electron mobility of $1 \times 10^{-6}$ cm$^2$/Vs or more is preferably used.

The electron transporting layer 908 is a layer superior in an electron transporting property, and specifically, the electron transporting layer 908 is preferably formed of an electron transporting material or a bipolar material, which has electron mobility of $1 \times 10^{-6}$ cm$^2$/Vs or more. The electron transporting material is a material having higher electron mobility than hole mobility, and preferably, a material having a value of a ratio of the electron mobility to the hole mobility (=electron mobility/hole mobility) of more than 100.

As a specific electron transporting material, a metal complex having a quinoline skeleton or a benzoquinoline skeleton such as Alq$_3$, Almq$_3$, or BeBq$_2$ which is described above; BAlq which is a mixed ligand complex; or the like is preferable. In addition, a metal complex having an oxazole-based or thiazole-based ligand such as Zn(BOX)$_2$ or Zn(BTZ)$_2$ can also be used. Furthermore, an oxadiazole derivative such as 2-(4-biphenylyl)-5-(4-tert-buthylphenyl)-1,3,4-oxadiazole (hereinafter, referred to as PBD) or 1,3-bis[5-(4-tert-buthylphenyl)-1,3,4-oxadiazol-2-yl]benzene (hereinafter, referred to as OXD-7); a triazole derivative such as 3-(4-biphenylyl)-4-phenyl-5-(4-tert-butylphenyl)-1,2,4-triazole (hereinafter, referred to as TAZ) or 3-(4-biphenylyl)-4-(4-ethylphenyl)-5-(4-tert-butylphenyl)-1,2,4-triazole (hereinafter, referred to as p-EtTAZ); a phenanthroline derivative such as bathophenanthroline (hereinafter, referred to as BPhen) or bathocuproin (hereinafter, referred to as BCP); and, in addition, 4,4-bis(5-methylbenzoxazolyl-2-yl)stilbene (hereinafter, referred to as BzOs); or the like can be used as well as a metal complex. It is to be noted that the materials described above can be used as the bipolar material.

Figure 9B:
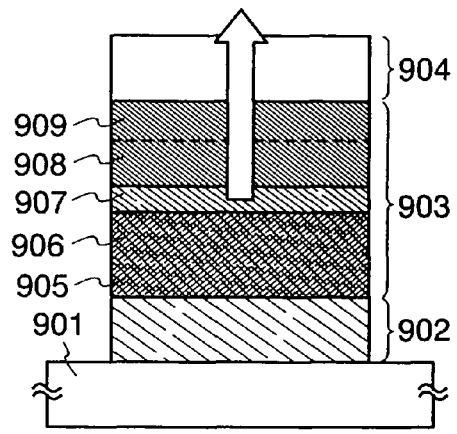

In the case of FIG. 9B, the second electrode 904 is formed of a transparent conductive film, the first electrode 902 is formed of a light-blocking (reflective) conductive film, and light generated in the light emitting layer 907 is emitted from the second electrode 904 side (in a direction of an arrow in the view). In this case, a laminated structure of layers constituting the layer 903 containing a light emitting material is the same structure as FIG. 9A. In addition, in FIG. 9B, layers denoted by the same numerals as in FIG. 9A except the first electrode 902 and the second electrode 904 (each layer included in the layer 903 containing a light emitting material) can be formed by using the same materials as in FIG. 9A, and the description is omitted here.

As a material for forming the first electrode 902 of FIG. 9B, a conductive material having a light-blocking property (reflectivity) is preferably used.

As a specific example, of a material for forming the first electrode 902, gold (Au), platinum (Pt), titanium (Ti), nickel (Ni), tungsten (W), chromium (Cr), molybdenum (Mo), iron (Fe), cobalt (Co), copper (Cu), palladium (Pd), or a nitride of a metal material such as titanium nitride (TiN), aluminum (Al), silver (Ag), an alkali metal, an alkaline earth metal such as magnesium (Mg), an alloy of such metals (Mg:Ag, Al:Li) or the like can be given. Furthermore, ITO, ITO containing silicon oxide, IZO or the like, which is a light-transmitting material can be used, in a case of using them by laminating with a material having a light-blocking property (reflectivity) in order to ensure the light-blocking property (reflectivity) required for the first electrode 902.

In the case of FIG. 9B, since the first buffer layer 905 is provided in contact with the first electrode 902, aluminum (Al), silver (Ag), an alkali metal, an alkaline earth metal such as magnesium (Mg), an alloy containing such metals (Mg:Ag, Al:Li) and the like, which are generally known as materials with a small work function, can be used. This is because an ohmic contact with respect to electrode materials having a wide range of work functions becomes possible by providing the first buffer layer 905.

As a material for forming the second electrode 904, a conductive material having a light-transmitting property is preferably used. As a specific example of a material for forming the second electrode 904, ITO, ITO containing silicon oxide, IZO, or the like can be used. Furthermore, in a case of using a thin film with a thickness of 100 nm or less for ensuring a light-transmitting property required for the second electrode 904, gold (Au), platinum (Pt), titanium (Ti), nickel (Ni), tungsten (W), chromium (Cr), molybdenum (Mo), iron (Fe), cobalt (Co), copper (Cu), palladium (Pd), a nitride of a metal material such as titanium nitride (TiN), aluminum (Al), silver (Ag), an alkali metal, an alkaline earth metal such as magnesium (Mg), an alloy of such metals (Mg:Ag, Al:Li) or the like can be used.

Figure 9C:
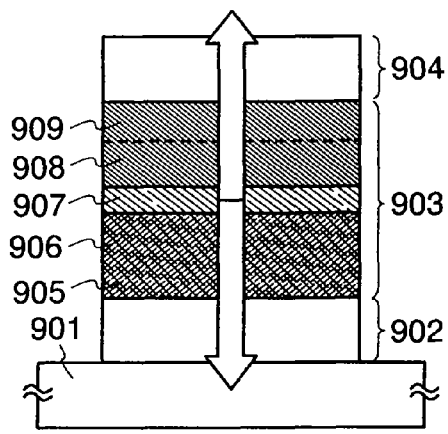

In the case of FIG. 9C, the first electrode 902 and the second electrode 904 are formed of transparent conductive films, and light generated in the light emitting layer 907 is emitted from both the first electrode 902 side and the second electrode 904 side (in directions of arrows in the view). In this case, a laminated structure of layers constituting the layer 903 containing a light emitting material is the same structure as FIG. 9A. In addition, in FIG. 9C, layers or an electrode denoted by the same numerals as in FIG. 9A except the second electrode 904 (the first electrode 902 and each layer included in the layer 903 containing a light emitting material) can be formed by using the same materials as in FIG. 9A, and the description is omitted here.

Figure 9D:
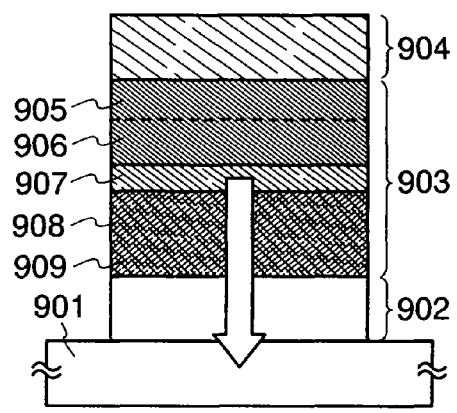

In the case of FIG. 9D, the first electrode 902 is formed of a transparent conductive film, the second electrode 904 is formed of a light-blocking (reflective) conductive film, and light generated in the light emitting layer 907 is emitted from the first electrode 902 side (in a direction of an arrow in the view). In this case, unlike the cases shown in FIGS. 9A to 9C, the layer 903 containing a light emitting material has a structure in which the second buffer layer 909, the light emitting layer 907, and the first buffer layer 905 are sequentially laminated from the first electrode 902 side. As shown in FIG. 9D, an electron transporting layer 908 may be provided between the second buffer layer 909 and the light emitting layer 907. In addition, a hole transporting layer 906 may be provided between the light emitting layer 907 and the first buffer layer 905.

In addition, in FIG. 9D, layers or electrodes denoted by the same numerals as in FIG. 9A can be formed by using the same materials as in FIG. 9A, and the description is omitted here.

Figure 9E:
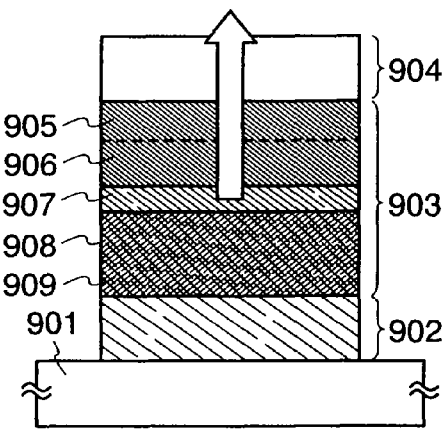

In the case of FIG. 9E, the second electrode 904 is formed of a transparent conductive film, the first electrode 902 is formed of a light-blocking (reflective) conductive film, and light generated in the light emitting layer 907 is emitted from the second electrode 904 side (in a direction of an arrow in the view). In this case, a laminated structure of layers constituting the layer 903 containing a light emitting material is the same structure as FIG. 9D. In addition, in FIG. 9E, layers or electrodes denoted by the same numerals as in FIG. 9B can be formed by using the same materials as in FIG. 9B, and the description is omitted here.

Figure 9F:
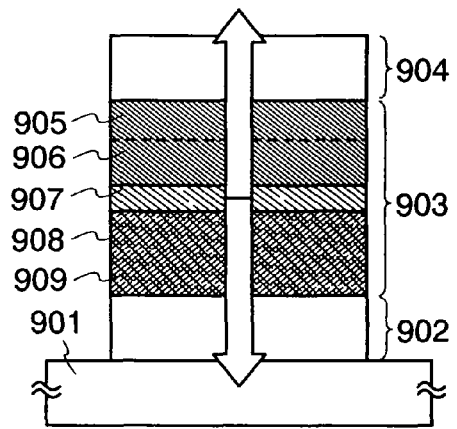

In the case of FIG. 9F, the first electrode 902 and the second electrode 904 are formed of transparent conductive films, and light generated in the light emitting layer 907 is emitted from both the first electrode 902 side and the second electrode 904 side (in directions of arrows in the view). In this case, a laminated structure of layers constituting the layer 903 containing a light emitting material is the same structure as FIG. 9D. In addition, in FIG. 9F, layers or electrodes denoted by the same numerals as in FIG. 9C can be formed by using the same materials as in FIG. 9C, and the description is omitted here.

Embodiment Mode 8

In this embodiment mode, the exterior view of a light emitting display panel as an example of a display panel will be described with reference to FIGS. 10A and 10B. FIG. 10A is a top view of a panel which is sealed with a sealant 1005 between a first substrate and a second substrate. FIG. 10B is a cross-sectional view thereof corresponding to a line A-A' and a line B-B' in FIG. 10A.

In FIG. 10A, reference numerals 1001, 1002, and 1003 indicated by dotted lines are a source side driver circuit, a pixel portion, and a gate side driver circuit, respectively. In addition, 1004 is a substrate, 1005 is a sealant, and there is a space inside surrounded by the sealant 1005. The sealant is preferably an epoxy-based resin having high viscosity. In addition, the sealant is desirably a material which does not transmit moisture or oxygen.

A reference numeral 1036 denotes a connection wiring for transmitting signals inputted to the source side driver circuit 1001 and the gate side driver circuit 1003, which receives video signals or clock signals from an FPC (Flexible Printed Circuit) 1009 which is an external input terminal. It is to be noted that, although only the FPC is shown in the view, the connection wiring 1036 is electrically connected to an external power source.

Next, the cross-sectional structure will be described with reference to FIG. 10B. Driver circuits and a pixel portion are formed over a substrate 1010, and the source side driver circuit 1001 as one of the driver circuits and the pixel portion 1002 are shown here.

The source side driver circuit 1001 includes a CMOS circuit in which an n-channel TFT 1013 and a p-channel TFT

1014 are combined. Alternatively, the driver circuit may be formed as a PMOS circuit, or an NMOS circuit, using TFTs. Although in this embodiment mode, a driver-integrated type in which the driver circuit is formed over the substrate is shown, the driver circuit is not necessarily formed over the substrate and may be formed exteriorly.

The pixel portion 1002 includes a plurality of pixels, each of which includes a switching TFT 1011 to which video signals from the source side driver circuit are inputted; a current controlling TFT 1012 connected to the switching TFT 1011 and having a function of controlling luminance of a light emitting element; and a first electrode (anode) 1006 electrically connected to the drain of the current controlling TFT 1012.

As an interlayer insulating film 1023 of such TFTs 1013, 1014, 1011, and 1012, an inorganic material (silicon oxide, silicon nitride, silicon oxynitride or the like), a material containing an organic material (polyimide, polyamide, polyimide amide, benzocyclobutene or siloxane polymer) as a main component can be used.

In addition, an insulator (also referred to as a bank, partition wall, barrier, mound or the like) 1024 is formed over each end of the first electrode 1006. In order to increase the coverage of a film formed over the insulator 1024, the insulator 1024 is formed to have a curved surface having curvature on the top end or the bottom end. Over the first electrode 1006, a layer 1015 containing a light emitting material in which a first buffer layer 1025, a light emitting layer 1026, a second buffer layer 1027 and the like are sequentially laminated is formed. The layer 1015 containing a light emitting material may further include a hole transporting layer and an electron transporting layer. Furthermore, a second electrode 1016 is formed over the layer 1015 containing a light emitting material. In this manner, a light emitting element 1018 including the first electrode (anode) 1006, the layer 1015 containing a light emitting material, and the second electrode (cathode) 1016 is formed. For the layer 1015 containing a light emitting material described in this embodiment mode, materials described in other embodiment modes as being used for a layer containing a light emitting material can be used. In addition, in the case of this embodiment mode, the light emitting element 1018 emits light to the substrate 1010 side.

Furthermore, auxiliary wirings 1008 and 1038 are formed in the same layer as source electrodes and drain electrodes of the TFTs (1013, 1014, 1011, and 1012). The auxiliary wiring 1008 is electrically connected to the second electrode 1016 in a connection portion 1019, and the auxiliary wiring 1035 is electrically connected to the second electrode 1016 in a connection portion 1034 through the first buffer layer 1025 and the second buffer layer 1027 interposed therebetween.

Furthermore, the auxiliary wiring 1035 is electrically connected to the connection wiring 1036, and electrically connected to the external power source via the FPC (Flexible Printed Circuit) 1009. The connection wiring 1036 and the FPC 1009 are electrically connected via an anisotropic conductive film (or an anisotropic conductive resin) 1037. The connection wiring 1036 is a wiring for transmitting signals inputted to the source side driver circuit 1001 and the gate side driver circuit 1003; which receives video signals or clock signals from the FPC 1009 which is an external input terminal.

In order to seal the light emitting element 1018 formed over the substrate 1010, a substrate 1004 is bonded by using the sealant 1005. It is to be noted that a spacer formed of a resin film may be provided so as to keep a space between the substrate 1004 and the light emitting element 1018. The space inside the sealant 1005 is filled with an inert gas such as nitrogen.

The substrate 1004 has a dent portion in a part thereof and a drying agent 1033 is provided therein so as to absorb moisture existing inside of the sealed space. As the drying agent 1033, a substance which adsorbs water ($H_2O$) by chemical adsorption such as an oxide of an alkaline earth metal such as calcium oxide (CaO) or barium oxide (BaO) is preferably used. However, the invention is not limited thereto, and a substance which adsorbs water by physical adsorption such as zeolite or silica gel may be used as well.

In the above-described manner, by forming a light emitting display panel sealing a light emitting element in a space inside, the light emitting element can be perfectly blocked from the outside, and materials such as moisture and oxygen which promote deterioration of the organic compound layer are prevented from entering from the outside. By connecting external circuits such as a power supply circuit and a controller to the light emitting display panel shown here, a light emitting display module can be formed.

It is to be noted that any of the Embodiment Modes 1 to 7 can be applied to this embodiment mode.

Embodiment Mode 9

In this embodiment mode, a method for mounting a driver circuit in a light emitting display panel of the invention will be described with reference to FIGS. 11A to 11C.

Figure 11A:
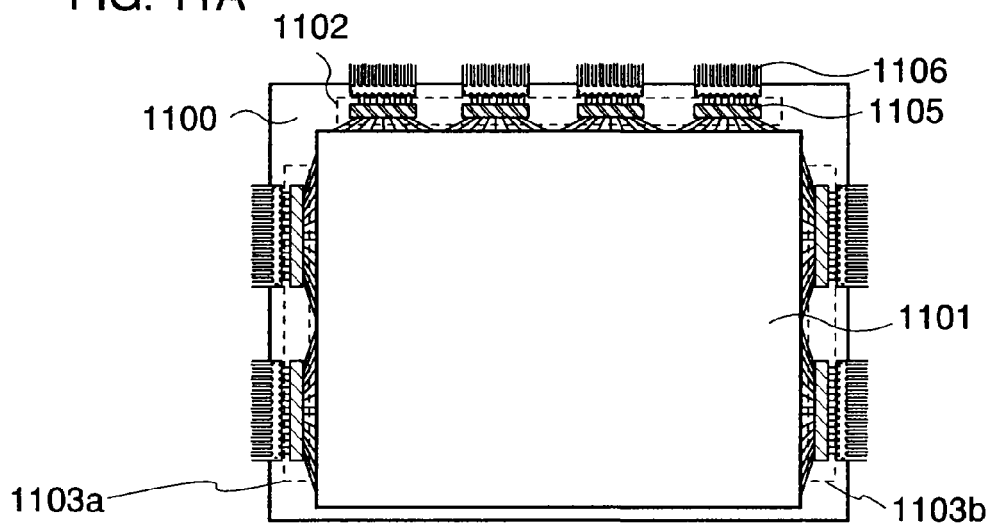
FIGS. 11A to 11C are views each describing a driver circuit mounted on a light emitting display panel.

In a case of FIG. 11A, a source side driver circuit 1102 and gate side driver circuits 1103a and 1103b are mounted at the periphery of a pixel portion 1101. That is, the source side driver circuit 1102 and the gate side driver circuits 1103a and 1103b are mounted by mounting IC chips 1105 on the substrate 1100 by a known mounting method using an anisotropic conductive adhesive and an anisotropic conductive film, a COG method, a wire bonding method, a reflow treatment using a solder bump, or the like. Furthermore, the IC chip 1105 is connected to an external circuit via an FPC (Flexible Printed Circuit) 1106.

Part of the source side driver circuit 1102, for example, an analog switch may be integrated over the substrate and the other portion thereof may be mounted by the IC chip separately.

Figure 11B:
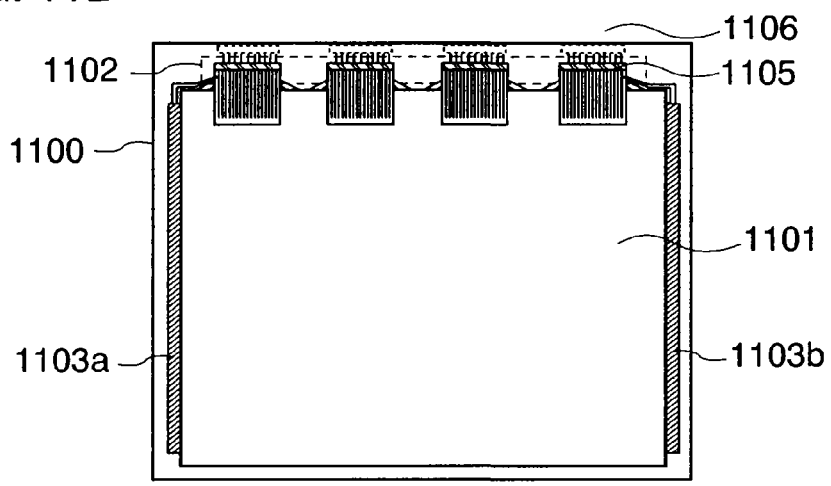

In addition, in a case of FIG. 11B, the pixel portion 1101, the gate side driver circuits 1103a and 1103b, and the like are integrated over the substrate, and the source side driver circuit 1102 and the like are separately mounted by the IC chips. That is, the IC chips 1105 are mounted on the substrate 1100 over which the pixel portion 1101, the gate side driver circuits 1103a and 1103b, and the like are integrated, by a mounting method such as a COG method; accordingly, the source side driver circuit 1102 and the like are mounted. Furthermore, the IC chip 1105 is connected to an external circuit via the FPC 1106.

Part of the source side driver circuit 1102, for example, an analog switch may be integrated over the substrate and the other portion thereof may be mounted by the IC chip separately.

Figure 11C:
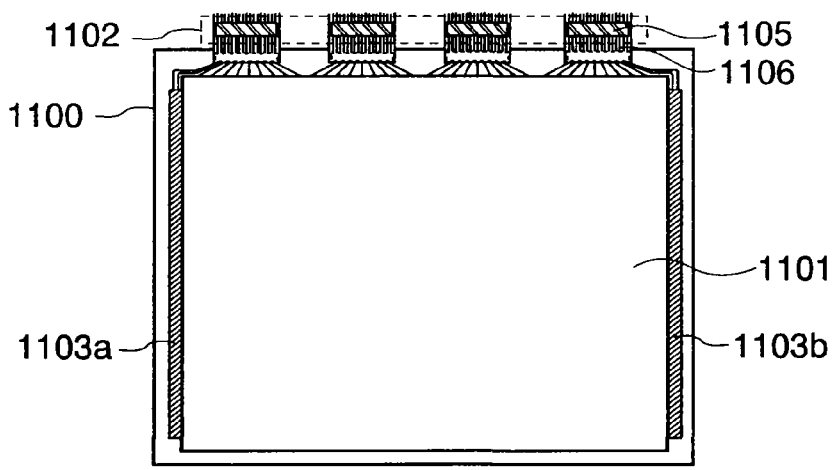

Moreover, in a case of FIG. 11C, the source side driver circuit 1102 and the like are mounted by a TAB method. The IC chip 1105 is connected to an external circuit via the FPC 1106. Although the source side driver circuit 1102 and the like are mounted by the TAB method in the case of FIG. 11C, the gate side driver circuit and the like may be mounted by the TAB method.

When the IC chip 1105 is mounted by the TAB method, a pixel portion can be provided widely with respect to the substrate, and accordingly, a narrowed frame can be achieved.

In addition, an IC which is formed over a glass substrate (hereinafter, referred to as a driver IC) may be provided instead of the IC chip 1105. As for the IC chip 1105, an IC chip is taken out of a circular silicon wafer; therefore, the shape of a mother substrate is limited. On the other hand, the driver IC has a mother substrate made of glass and the shape is not limited; thus, the productivity can be improved. Therefore, the shape and the size of the driver IC can be set freely. For example, in a case of forming the driver IC having a long side length of 15 to 80 mm, the required number of IC chips can be reduced as compared with a case of mounting IC chips. As a result, the number of connection terminals can be reduced, and the yield in manufacturing can be improved.

A driver IC can be formed using a crystalline semiconductor formed over a substrate, and the crystalline semiconductor may be formed by being irradiated with continuous wave laser light. A semiconductor film obtained by being irradiated with continuous wave laser light has crystal grains having large diameter with less crystal defects. Accordingly, a transistor having such a semiconductor film has favorable mobility and response speed and becomes capable of high speed drive, which is preferable for a driver IC.

Embodiment Mode 10

As electronic devices equipped with light emitting devices of the invention, the following can be given: a television device (also simply referred to as a TV or a television receiver), a camera such as a digital camera or a digital video camera, a cellular phone device (also simply referred to as a cellular phone handset or a cellular phone), a portable information terminal such as PDA, a portable game machine, a computer monitor, a computer, an audio reproducing device such as a car audio, an image reproducing device provided with a recording medium such as a home game machine, and the like. The preferable mode thereof will be explained with reference to FIGS. 12A to 12E.

Figure 12A:
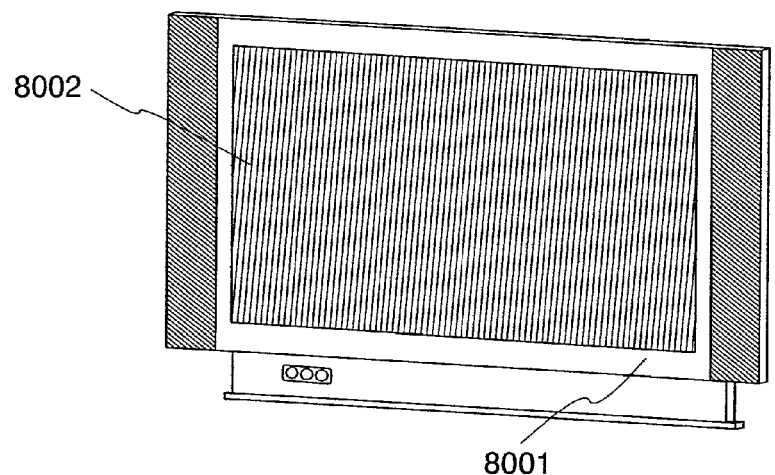
FIGS. 12A to 12E are views each describing an electronic apparatus.

A television device shown in FIG. 12A includes a main body 8001, a display portion 8002, and the like. The light emitting device of the invention can be applied to the display portion 8002. In the light emitting device of the invention, an auxiliary wiring electrically connected to a second electrode of a light emitting element is formed also in a pixel portion of a light emitting display panel, therefore variation in a voltage applied to each light emitting element of pixels can be restrained. Accordingly, unevenness of luminance among pixels in the pixel portion can be prevented, and a television device capable of realizing excellent image display can be provided.

Figure 12B:
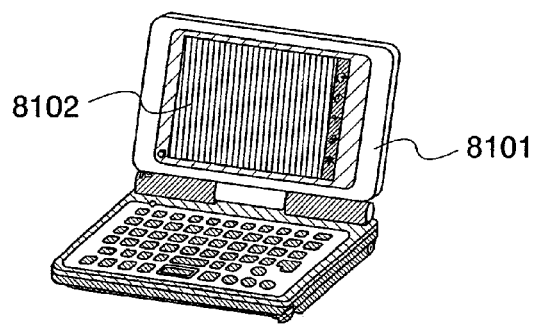

A portable information terminal device shown in FIG. 12B includes a main body 8101, a display portion 8102, and the like. The light emitting device of the invention can be applied to the display portion 8102. In the light emitting device of the invention, an auxiliary wiring electrically connected to a second electrode of a light emitting element is formed also in a pixel portion of a light emitting display panel, therefore variation in a voltage applied to each light emitting element of pixels can be restrained. Accordingly, unevenness of luminance among pixels in the pixel portion can be prevented, and a portable information terminal device capable of realizing excellent image display can be provided.

Figure 12C:
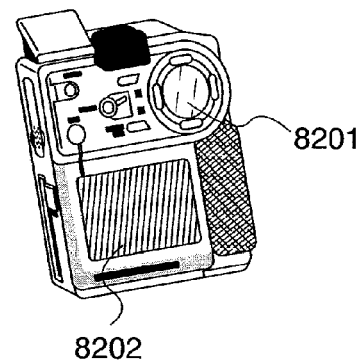

A digital video camera shown in FIG. 12C includes a main body 8201, a display portion 8202, and the like. The light emitting device of the invention can be applied to the display portion 8202. In the light emitting device of the invention, an auxiliary wiring electrically connected to a second electrode of a light emitting element is formed also in a pixel portion of a light emitting display panel, therefore variation in a voltage applied to each light emitting element of pixels can be restrained. Accordingly, unevenness of luminance among pixels in the pixel portion can be prevented, and a digital video camera capable of realizing excellent image display can be provided.

Figure 12D:
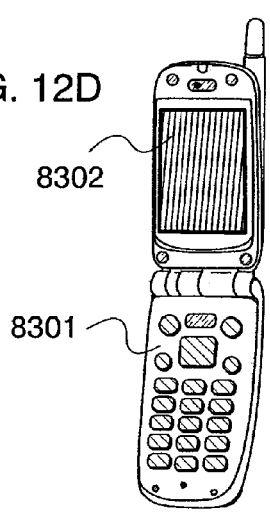

A cellular phone handset shown in FIG. 12D includes a main body 8301, a display portion 8302, and the like. The light emitting device of the invention can be applied to the display portion 8302. In the light emitting device of the invention, an auxiliary wiring electrically connected to a second electrode of a light emitting element is formed also in a pixel portion of a light emitting display panel, therefore variation in a voltage applied to each light emitting element of pixels can be restrained. Accordingly, unevenness of luminance among pixels in the pixel portion can be prevented, and a cellular phone handset capable of realizing excellent image display can be provided.

Figure 12E:
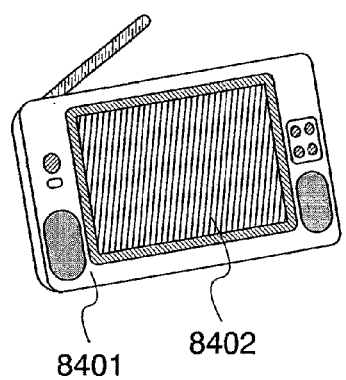

A portable television device shown in FIG. 12E includes a main body 8401, a display portion 8402, and the like. The light emitting device of the invention can be applied to the display portion 8402. In the light emitting device of the invention, an auxiliary wiring electrically connected to a second electrode of a light emitting element is formed also in a pixel portion of a light emitting display panel, therefore variation in a voltage applied to each light emitting element of pixels can be restrained. Accordingly, unevenness of luminance among pixels in the pixel portion can be prevented, and a portable television device capable of realizing excellent image display can be provided. In addition, the light emitting device of the invention can be widely applied to various television devices such as a small sized one incorporated in a portable terminal such as a cellular phone handset, a medium sized one which is portable, and a large sized one (for example, 40 inches or more in size).

As described above, by using the light emitting device of the invention which can prevent unevenness of luminance among pixels in the pixel portion, electronic devices capable of realizing excellent image display can be provided.

Embodiment 1

A light emitting display panel of the invention comprises a pixel portion and a peripheral portion. In the pixel portion are formed a light emitting element and a first connection portion, the latter being constituted by a pair of conductors (the auxiliary wiring and the second electrode described in this specification) and a buffer layer (either one or both of the first buffer layer and the second buffer layer described in this specification). In the peripheral portion is formed a second connection portion with a structure in which a buffer layer is not interposed between a pair of conductors.

The second electrode included in part of the light emitting element is electrically connected to the auxiliary wiring, and a voltage to be applied to the second electrode is given from the outside via the auxiliary wiring. Therefore, when electrical connection between the auxiliary wiring and the second electrode is insufficient, a voltage is not applied to the second electrode sufficiently, and device characteristics of the light emitting element deteriorate.

Figure 13A:
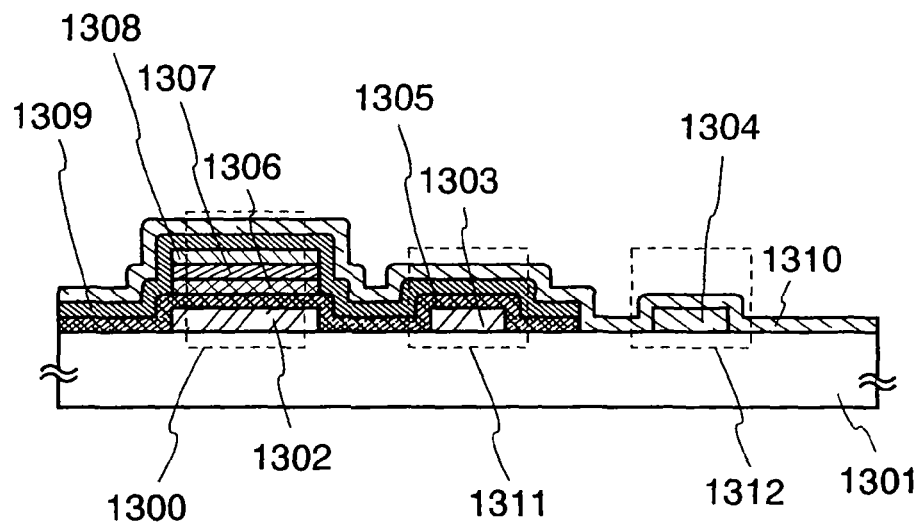
FIGS. 13A to 13C are views each describing a structure of a light emitting element shown in Embodiment 1.
Figure 13B:
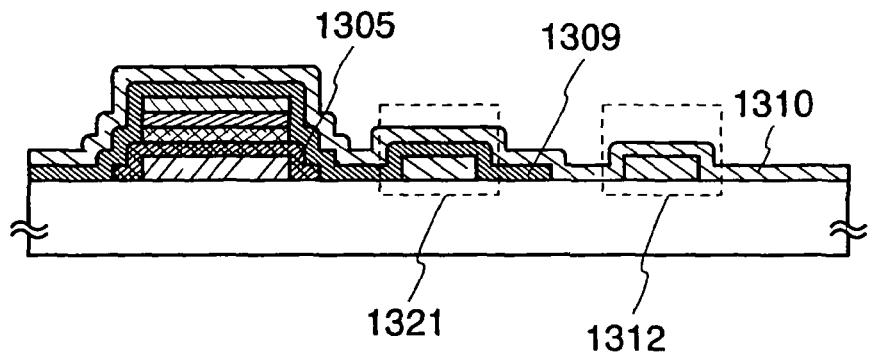
Figure 13C:
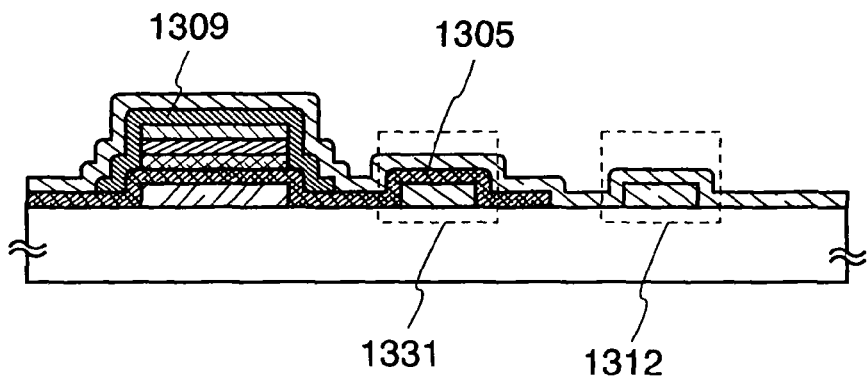

Therefore, in this embodiment, elements (including the light emitting element, the first connection portion, and the second connection portion) shown in FIGS. 13A to 13C were manufactured, and device characteristics of the light emitting element in the case of using the first connection portion (that is, a voltage is applied to the second electrode of the light emitting element from the first connection portion) were measured.

First, structures of the elements shown in FIGS. 13A to 13C and its manufacturing methods will be described. As for the elements shown in FIGS. 13A to 13C, a first electrode 1302 of a light emitting element, a first auxiliary wiring 1303, and a second auxiliary wiring 1304 are formed over a substrate 1301. In this embodiment, the first electrode 1302 functions as an anode. The first electrode 1302 and the first auxiliary wiring 1303 are formed using ITO as a transparent conductive film, with a thickness of 110 nm by a sputtering method. The second auxiliary wiring 1304 is formed using a laminated film in which a Ti film (100 nm) is laminated over an Al film (300 nm), by a sputtering method. As the sputtering method used here, a bipolar sputtering method, an ion beam sputtering method, an opposite target sputtering method, and the like can be given as the examples. The size of the first electrode 1302, the first auxiliary wiring 1303, and the second auxiliary wiring 1304 each is set to be 2 mm×2 mm.

A layer containing a light emitting material is formed over the first electrode (anode) 1302. It is to be noted that the layer containing a light emitting material of this embodiment has a laminated structure including a first buffer layer 1305, a hole transporting layer 1306, a light emitting layer 1307, an electron transporting layer 1308, and a second buffer layer 1309, from the first electrode 1302 side.

In FIGS. 13A to 13C, elements with laminated structures partly different from each other are shown. In FIGS. 13A to 13C, the laminated structures of the light emitting element 1300 and the second connection portion 1312 are in common, and the laminated structures of the first connection portions 1311, 1321, and 1331 are different from each other. The light emitting element 1300 has a laminated structure in which the first electrode 1302, the first buffer layer 1305, the hole transporting layer 1306, the light emitting layer 1307, the electron transporting layer 1308, and a second electrode 1310 are laminated. The second connection portion 1312 has a laminated structure in which a second auxiliary wiring 1304 and the second electrode 1310 are laminated. In the first connection portion 1311 of FIG. 13A, the first buffer layer 1305 and the second buffer layer 1309 are formed, laminated over the first auxiliary wiring 1303. In the first connection portion 1321 of FIG. 13B, the second buffer layer 1309 and the second electrode 1310 are formed, laminated over the first auxiliary wiring 1303. In the first connection portion 1331 of FIG. 13C, the first buffer layer 1305 and the second electrode 1310 are formed, laminated over the first auxiliary wiring 1303. It is to be noted that, in any of FIGS. 13A to 13C, the hole transporting layer 1306, the light emitting layer 1307, and the electron transporting layer 1308 are formed only over the first electrode 1302.

A substrate over which the first electrode 1302, the first auxiliary wiring 1303, and the second auxiliary wiring 1304 are formed is fixed to a substrate holder of a vacuum deposition system which is commercially available, so that a surface on which the first electrode 1302 and the like are formed is placed downward. DNTPD is put in one of evaporation sources provided inside the vacuum deposition system, and molybdenum oxide as a metal compound is put in the other evaporation source, so that the first buffer layer 1305 is formed to have a thickness of 120 nm by a co-evaporation method using resistance heating. A weight ratio of DNTPD to molybdenum oxide in the first buffer layer 1305 which is formed here is set to be 1:0.5 (molar ratio is set to be 1:1.8) (=DNTPD:molybdenum oxide).

In a case of forming the elements of FIGS. 13A and 13C, the first buffer layer 1305 is formed by using a mask so as to be formed in a desired position over the first electrode 1302 and the first auxiliary wiring 1303. In a case of forming the element of FIG. 13B, the first buffer layer 1305 is formed by using a mask so as to be formed in a desired position over the first electrode 1302.

Next, the hole transporting layer 1306 is formed by using a material with an excellent hole transporting property. Here, NPB as a material with an excellent hole transporting property is deposited to a thickness of 10 nm by a deposition method using resistance heating. The hole transporting layer 1306 is formed by using a mask so as to be formed in a desired position over the first electrode 1302.

Next, the light emitting layer 1307 is formed. It is to be noted that light is emitted when holes and electrons are recombined in the light emitting layer 1307. Here, the light emitting layer 1307 is formed to a thickness of 40 nm by a co-evaporation method which is also used for the buffer layer, using $Alq_3$ and coumarin 6. The weight ratio of $Alq_3$ and coumarin 6 was set to be 1:0.01 (molar ratio is 1:0.013) (=$Alq_3$:coumarin 6). In this manner, coumarin 6 is dispersed and contained in a layer of $Alq_3$. The light emitting layer 1307 is also formed by using a mask so as to be formed in a desired position over the first electrode 1302.

Next, the electron transporting layer 1308 is formed. The electron transporting layer 1308 is formed to a thickness of 15 nm by a deposition method which is also used for the hole transporting layer 1306, using $Alq_3$. The electron transporting layer 1308 is also formed by using a mask so as to be formed in a desired position over the first electrode 1302.

Next, the second buffer layer 1309 is formed. The second buffer layer 1309 is formed to a thickness of 15 nm by a co-evaporation method which is also used for the first buffer layer 1305, using BCP and Li.

In a case of forming the elements of FIGS. 13A and 13B, the second buffer layer 1309 is formed by using a mask so as to be formed in a desired position over the first electrode 1302 and the first auxiliary wiring 1303. In a case of forming the element of the FIG. 13C, the second buffer layer 1309 is formed by using a mask so as to be formed in a desired position over the first electrode 1302.

After forming the layer containing a light emitting material, which has a laminated structure, in the above-described manner, the second electrode 1310 functioning as a cathode is formed by a sputtering method or a deposition method. In this embodiment, the second electrode 1310 is obtained by depositing aluminum to a thickness of 200 nm by a deposition method over the layer containing a light emitting material. The second electrode 1310 is formed over the first electrode 1302, the first auxiliary wiring 1303, and the second auxiliary wiring 1304.

Figure 14:
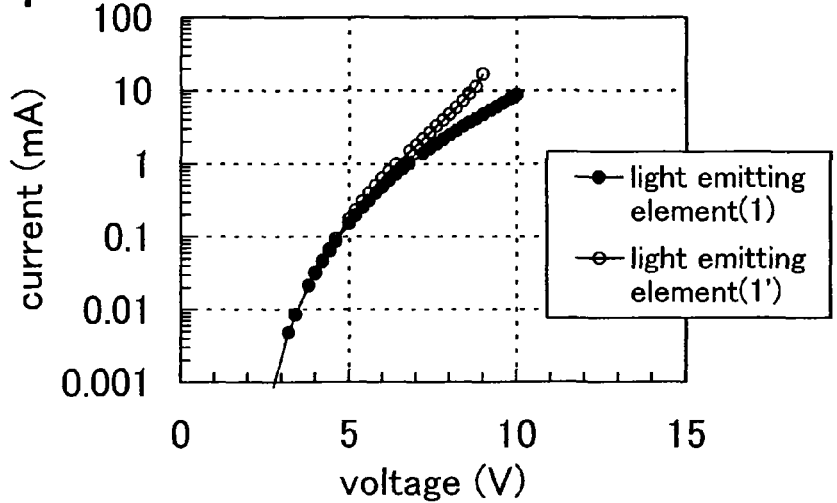
FIG. 14 is a graph describing a voltage-current characteristic of a light emitting element shown in Embodiment 1.
Figure 15:
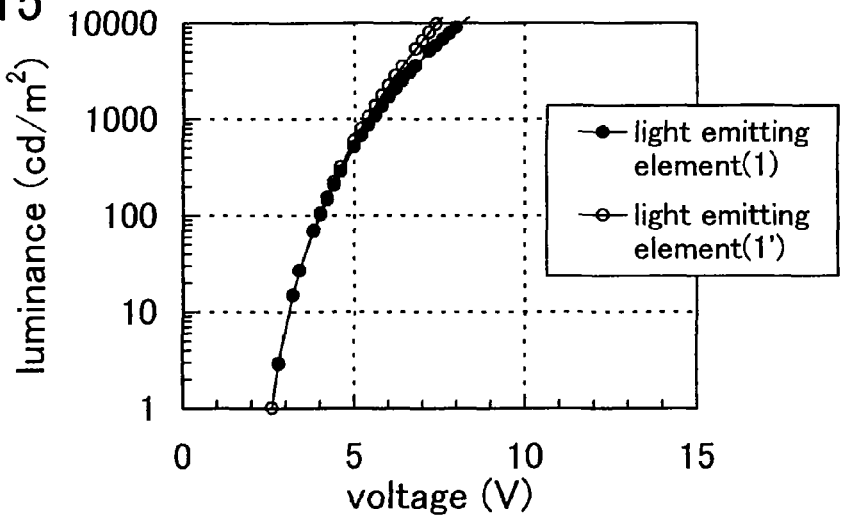
FIG. 15 is a graph describing a voltage-luminance characteristic of a light emitting element shown in Embodiment 1.
Figure 16:
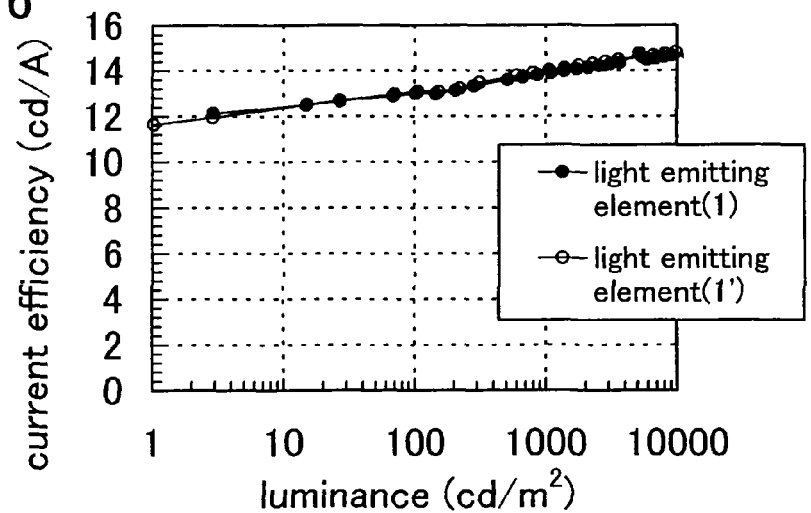
FIG. 16 is a graph describing a luminance-current efficiency characteristic of a light emitting element shown in Embodiment 1.
Figure 17:
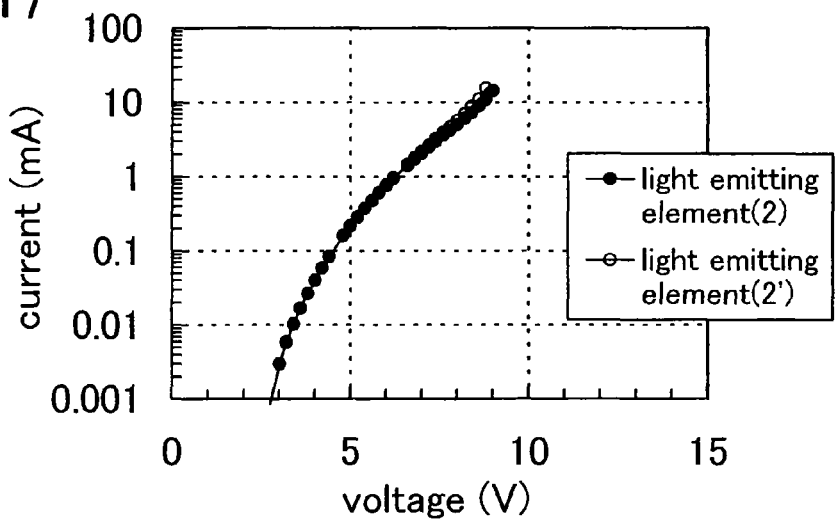
FIG. 17 is a graph describing a voltage-current characteristic of a light emitting element shown in Embodiment 1.
Figure 18:
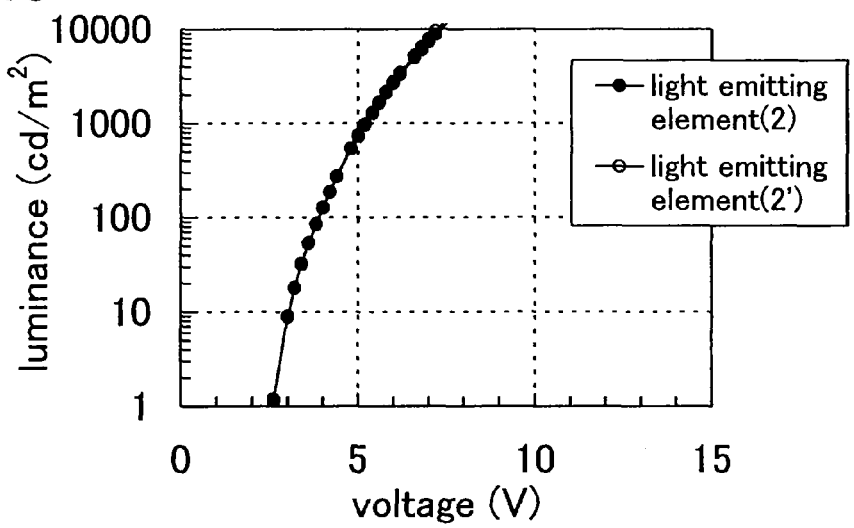
FIG. 18 is a graph describing a voltage-luminance characteristic of a light emitting element shown in Embodiment 1.
Figure 19:
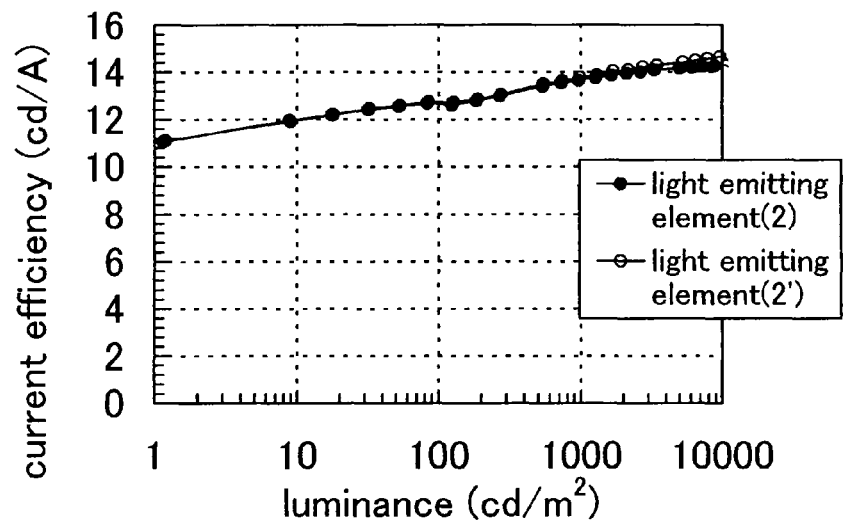
FIG. 19 is a graph describing a luminance-current efficiency characteristic of a light emitting element shown in Embodiment 1.
Figure 20:
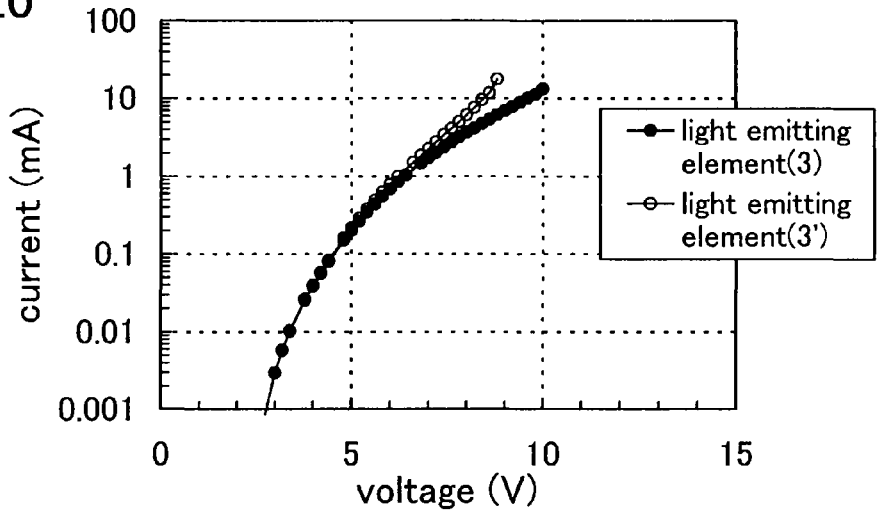
FIG. 20 is a graph describing a voltage-current characteristic of a light emitting element shown in Embodiment 1.
Figure 21:
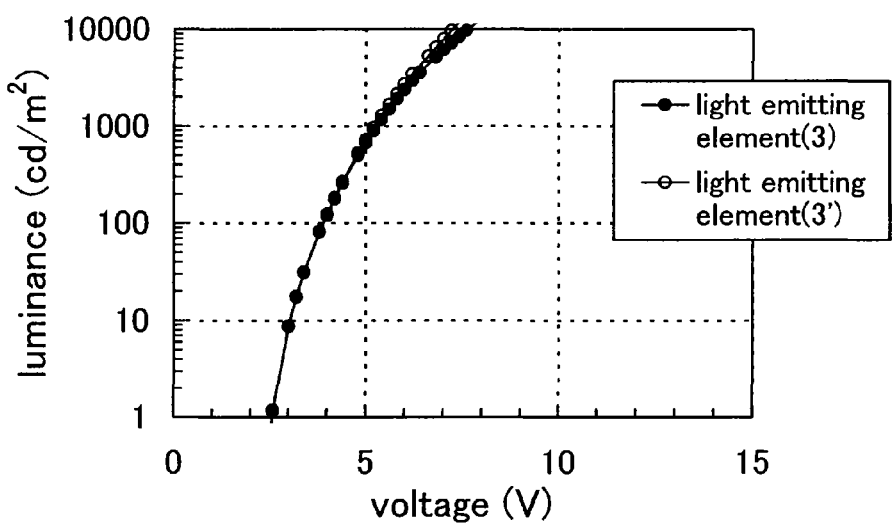
FIG. 21 is a graph describing a voltage-luminance characteristic of a light emitting element shown in Embodiment 1.
Figure 22:
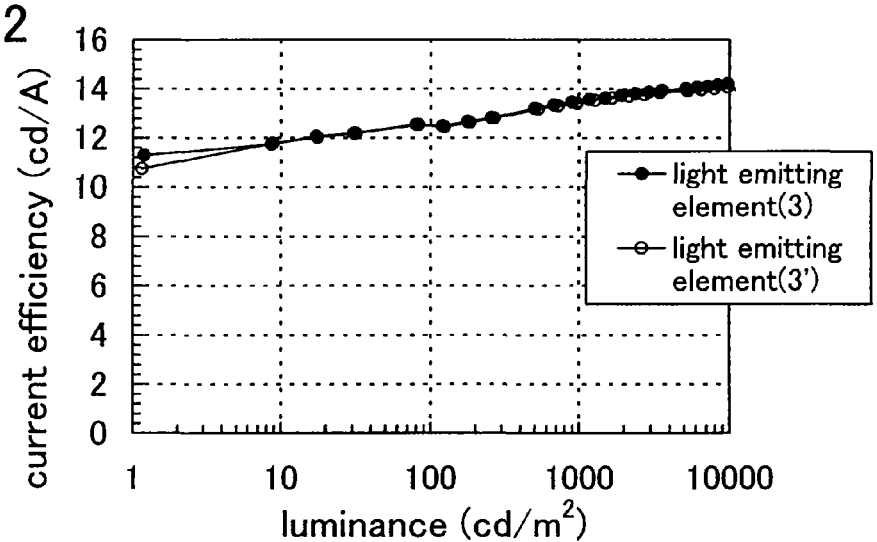
FIG. 22 is a graph describing a luminance-current efficiency characteristic of a light emitting element shown in Embodiment 1.

Of the elements manufactured in the above-described manner, a current-voltage characteristic, a luminance-voltage characteristic, and a current efficiency-luminance characteristic, in a case where the first connection portion is used, (that is, a voltage is applied to the second electrode of the light emitting element from the first connection portion) of the element shown in FIG. 13A were measured. And the results are shown with plots indicated by black circles (a light emitting element (1)) in FIGS. 14 to 16, respectively. In addition, a current-voltage characteristic, a luminance-voltage characteristic, and a current efficiency-luminance characteristic, in a case where the first connection portion is used, of the element shown in FIG. 13B were measured. And the results are shown with plots indicated by black circles (a light emitting element (2)) in FIGS. 17 to 19, respectively. In addition, a current-voltage characteristic, a luminance-voltage characteristic, and a current efficiency-luminance characteristic, in a case where the first connection portion is used, of the element shown in FIG. 13C were measured. And the results are shown with plots indicated by black circles (a light emitting element (3)) in FIGS. 20 to 22, respectively.

The light emitting element (I) (the light emitting element 1300 which is combined with the first connection portion 1311, in FIG. 13A) has, specifically, a structure in which the first electrode 1302: ITO (110 nm), the first buffer layer 1305: (DNTPD, $MoO_3$) (120 nm), the hole transporting layer 1306: NPB (10 nm), the light emitting layer 1307: $Alq_3$+coumarin 6 (40 nm), the electron transporting layer 1308: $Alq_3$ (40 nm), the second buffer layer 1309: BCP+Li (15 nm), the second electrode 1310: Al (110 nm), the second buffer layer 1309: BCP, Li (15 nm), the first buffer layer 1305: (DNTPD, $MoO_3$) (120 nm), and the first auxiliary wiring 1303: ITO (100 nm) are sequentially in contact with each other.

The light emitting element (2) (the light emitting element 1300 which is combined with the first connection portion 1321, in FIG. 13B) has, specifically, a structure in which the first electrode 1302: ITO (110 nm), the first buffer layer 1305: (DNTPD, $MoO_3$) (120 nm), the hole transporting layer: NPB (10 nm), the light emitting layer: $Alq_3$+coumarin 6 (40 nm), the electron transporting layer: $Alq_3$ (40 nm), the second buffer layer 1309: BCP+Li (15 nm), the second electrode 1310: Al (110 nm), the second buffer layer 1309: BCP, Li (15 nm), and the first auxiliary wiring 1303: ITO (100 nm) are sequentially in contact with each other.

The light emitting element (3) (the light emitting element 1300 which is combined with the first connection portion 1331, in FIG. 13C) has, specifically, a structure in which the first electrode 1302: ITO (110 nm), the first buffer layer 1305: (DNTPD, $MoO_3$) (120 nm), the hole transporting layer: NPB (10 nm), the light emitting layer: $Alq_3$, coumarin 6 (40 nm), the electron transporting layer: $Alq_3$ (40 nm), the second buffer layer 1309: BCP, Li (15 nm), the second electrode 1310: Al (110 nm), the first buffer layer 1305: (DNTPD, $MoO_3$) (120 nm), and the first auxiliary wiring 1303: ITO (100 nm) are sequentially in contact with each other.

In the current-voltage characteristics of the light emitting elements (1), (2), and (3) each using the first connection portion (FIGS. 14, 17, and 20), a current of approximately 1.0 mA flowed when a voltage of 7V was applied, in any of the cases. This result shows that a current flows sufficiently into the layer containing a light emitting material of the light emitting element even in the case where either one or both of the first buffer layer 1305 and the second buffer layer 1309 are interposed between the second electrode 1310 and the first auxiliary wiring 1303 (in the case where the first connection portion is used).

In addition, in the luminance-voltage characteristics of the light emitting elements (1), (2), and (3) each using the first connection portion (FIGS. 15, 18, and 21), approximately 1000 $cd/m^2$ of luminance was obtained when a voltage of 6V was applied, in any of the cases. This result shows that a preferable luminance characteristic to a voltage can be obtained even in the case where either one or both of the first buffer layer 1305 and the second buffer layer 1309 are interposed between the second electrode 1310 and the first auxiliary wiring 1303 (in the case where the first connection portion is used).

In addition, in the current efficiency-luminance characteristics of the light-emitting elements (1), (2), and (3) each using the first connection portion (FIGS. 16, 19, and 22), the current efficiency when luminance of 100 $cd/m^2$ was obtained was approximately 13 cd/A, in any of the cases. This result shows that holes and electrons exist with a good balance in the layer containing a light emitting material of the light emitting element, and they are in an environment where they can be recombined effectively.

Comparative Example 1

For comparison with the above, the element characteristics of the light emitting elements 1300 of FIGS. 13A to 13C in a case of using the second connection portion 1312, which are set to be a light emitting element (1'), a light emitting element (2'), and a light emitting element (3') respectively, were measured. A current-voltage characteristic, a luminance-voltage characteristic, and a current efficiency-luminance characteristic of the light emitting element 1300 having the second connection portion 1312 in FIG. 13A are shown with plots indicated by white circles (the light emitting element (1')) in FIGS. 14 to 16, respectively. In addition, a current-voltage characteristic, a luminance-voltage characteristic, and a current efficiency-luminance characteristic of the light emitting element 1300 having the second connection portion 1312 in FIG. 13B are shown with plots indicated by white circles (the light emitting element (2')) in FIGS. 17 to 19, respectively. In addition, a current-voltage characteristic, a luminance-voltage characteristic, and a current efficiency-luminance characteristic of the light emitting element 1300 having the second connection portion 1312 in FIG. 13C are shown with plots indicated by white circles (the light emitting element (3')) in FIGS. 20 to 22, respectively.

It is to be noted that a structure of the light emitting element (1') in FIG. 13A, a structure of the light emitting element (2') in FIG. 13B, and a structure of the light emitting element (3') in FIG. 13C are the same, which is a structure in which the first electrode 1302: ITO (110 nm), the first buffer layer 1305: (DNTPD, $MoO_3$) (120 nm), the hole transporting layer: NPB (10 nm), the light emitting layer: $Alq_3$, coumarin 6 (40 nm), the electron transporting layer: $Alq_3$ (40 nm), the second buffer layer 1309: BCP, Li (15 nm), the second electrode 1310: Al (110 nm), and the second auxiliary wiring 1304: Ti (100 nm), Al (300 nm) are sequentially in contact with each other.

In the current-voltage characteristics (FIGS. 14, 17, and 20), a voltage of approximately 6.8V was required to be applied to feed a current of 1.0 mA, in any of the cases from the light emitting element (1') to the light emitting element (3'). That is, the light emitting element (1'), the light emitting element (2'), and the light emitting element (3') show the comparable element characteristics to the light emitting element (1), the light emitting element (2), and the light emitting element (3) of the invention.

In the luminance-voltage characteristics (FIGS. 15, 18, and 21) in the cases of the element structures shown in FIGS. 13A to 13C, a voltage of approximately 5.5 V was required to be applied to obtain luminance of approximately 1000 $cd/m^2$, in any of the cases from the light emitting element (1') to the light emitting element (3'). That is, the light emitting element (1'), the light emitting element (2'), and the light emitting element (3') show the comparable element characteristics to the light emitting element (1), the light emitting element (2), and the light emitting element (3) of the invention.

Furthermore, in the current efficiency-luminance characteristics (FIGS. 16, 19, and 22) in the cases of the element structures shown in FIGS. 13A to 13C, luminance of 100 $cd/m^2$ was obtained with respect to current efficiency of approximately 13 cd/A, in any of the cases from the light emitting element (1') to the light emitting element (3'). That is, the light emitting element (1'), the light emitting element (2'), and the light emitting element (3') show the comparable element characteristics to the light emitting element (1), the light emitting element (2), and the light emitting element (3) of the invention.

Through the above results, in a light emitting element of the present invention, it is verified that the element characteristic is not affected much in a case where a first connection portion (1311, 1321 or 1331) formed by sandwiching either one or both of a first buffer layer 1305 and a second buffer layer 1309 between a second electrode 1310 and a first auxiliary wiring 1303 is used, or in a case where a second connection portion 1312 where the second electrode 1310 and a second auxiliary wiring 1304 are electrically connected directly is used.

This application is based on Japanese Patent Application serial No. 2005-229439 filed in Japan Patent Office on Aug. 8, 2005, the contents of which are hereby incorporated by reference.

What is claimed is:

1. A light emitting display device comprising:
   a light emitting element including a first electrode, a second electrode, and a layer containing a light emitting material interposed therebetween; and
   an auxiliary wiring which is electrically connected to the second electrode,
   wherein the layer containing the light emitting material includes at least a first buffer layer, a light emitting layer, and a second buffer layer,
   wherein the first buffer layer comprises a material having a hole transporting property, the material comprising an organic compound and any one of molybdenum oxide, vanadium oxide, ruthenium oxide, rhenium oxide, titanium oxide, chromium oxide, zirconium oxide, hafnium oxide, tantalum oxide, tungsten oxide, and silver oxide, and
   wherein either one or both of the first buffer layer and the second buffer layer are interposed between the auxiliary wiring and the second electrode.

2. A light emitting display device according to claim 1, wherein the material having a hole transporting property is a composite material of the organic compound and a metal compound.

3. A light emitting display device according to claim 1, wherein the first buffer layer includes a metal compound and at least one of an aromatic amine compound, a carbazole derivative, and an aromatic hydrocarbon (including an aromatic hydrocarbon including at least one vinyl skeleton).

4. A light emitting display device according to claim 1, wherein the second buffer layer is a layer comprising a material having an electron transporting property.

5. A light emitting display device according to claim 4, wherein the material having an electron transporting property is a material selected from an alkali metal, an alkaline earth metal, an alkali metal oxide, an alkaline earth metal oxide, an alkali metal nitride, and an alkaline earth metal nitride.

6. A light emitting display device according to claim 4, wherein the material having an electron transporting property is a composite material of an organic compound and a material selected from an alkali metal, an alkaline earth metal, an alkali metal oxide, an alkaline earth metal oxide, an alkali metal nitride, and an alkaline earth metal nitride.

7. A light emitting display device according to claim 4, wherein the material having an electron transporting property is a composite material of an electron transporting material and a material selected from an alkali metal, an alkaline earth metal, an alkali metal oxide, an alkaline earth metal oxide, an alkali metal nitride, and an alkaline earth metal nitride.

8. A light emitting display device according to claim 1,
   wherein the first buffer layer is in contact with either one of the first electrode or the second electrode; and
   wherein the second buffer layer is in contact with the other one of the first electrode or the second electrode.

9. A light emitting display device according to claim 1, wherein the first buffer layer and the second buffer layer are in direct contact.

10. A light emitting display device comprising:
    a light emitting element including a first electrode, a second electrode, and a layer containing a light emitting material interposed therebetween; and
    a first auxiliary wiring and a second auxiliary wiring which are electrically connected to the second electrode,
    wherein the layer containing the light emitting material includes at least a first buffer layer, a light emitting layer, and a second buffer layer,
    wherein the first buffer layer comprises a material having a hole transporting property, the material comprising an organic compound and any one of molybdenum oxide, vanadium oxide, ruthenium oxide, rhenium oxide, titanium oxide, chromium oxide, zirconium oxide, hafnium oxide, tantalum oxide, tungsten oxide, and silver oxide,
    wherein either one or both of the first buffer layer and the second buffer layer are interposed between the first auxiliary wiring and the second electrode, and
    wherein the second auxiliary wiring is in contact with the second electrode.

11. A light emitting display device according to claim 10, wherein the material having a hole transporting property is a composite material of the organic compound and a metal compound.

12. A light emitting display device according to claim 10, wherein the first buffer layer includes a metal compound and at least one of an aromatic amine compound, a carbazole derivative, and an aromatic hydrocarbon (including an aromatic hydrocarbon including at least one vinyl skeleton).

13. A light emitting display device according to claim 10, wherein the second buffer layer is a layer comprising a material having an electron transporting property.

14. A light emitting display device according to claim 13, wherein the material having an electron transporting property is a material selected from an alkali metal, an alkaline earth metal, an alkali metal oxide, an alkaline earth metal oxide, an alkali metal nitride, and an alkaline earth metal nitride.

15. A light emitting display device according to claim 13, wherein the material having an electron transporting property is a composite material of an organic compound and a material selected from an alkali metal, an alkaline earth metal, an alkali metal oxide, an alkaline earth metal oxide, an alkali metal nitride, and an alkaline earth metal nitride.

16. A light emitting display device according to claim 13, wherein the material having an electron transporting property is a composite material of an electron transporting material or a bipolar material and a material selected from an alkali metal, an alkaline earth metal, an alkali metal oxide, an alkaline earth metal oxide, an alkali metal nitride, and an alkaline earth metal nitride.

17. A light emitting display device according to claim 10,
    wherein the first buffer layer is in contact with either one of the first electrode or the second electrode; and
    wherein the second buffer layer is in contact with the other one of the first electrode or the second electrode.

18. A light emitting display device according to claim 10, wherein the first buffer layer and the second buffer layer are in direct contact.

19. A method for manufacturing a light emitting display device, the method comprising:
forming a first electrode, a first auxiliary wiring, and a second auxiliary wiring over a substrate;
forming a first buffer layer over the first electrode and the first auxiliary wiring;
forming a light emitting layer over the first electrode;
forming a continuous second buffer layer over the first electrode and the first auxiliary wiring; and
forming a second electrode over the first electrode, the first auxiliary wiring, and the second auxiliary wiring,
wherein a light emitting element comprises the first electrode, the first buffer layer, the light emitting layer, the second buffer layer, and the second electrode,
wherein the first buffer layer comprises a material having a hole transporting property, the material comprising an organic compound and any one of molybdenum oxide, vanadium oxide, ruthenium oxide, rhenium oxide, titanium oxide, chromium oxide, zirconium oxide, hafnium oxide, tantalum oxide, tungsten oxide, and silver oxide,
wherein a first connection portion comprises the first auxiliary wiring, the first buffer layer, the second buffer layer, and the second electrode, and
wherein a second connection portion comprises the second auxiliary wiring and the second electrode.

20. A method for manufacturing a light emitting display device according to claim 19, wherein the layer comprising a material having a hole transporting property includes the organic compound and a metal compound.

21. A method for manufacturing a light emitting display device according to claim 20, wherein the organic compound is any one of an aromatic amine compound, a carbazole derivative, and an aromatic hydrocarbon (including an aromatic hydrocarbon including at least one vinyl skeleton).

22. A method for manufacturing a light emitting display device according to claim 19, wherein the second buffer layer is formed of a layer comprising a material having an electron transporting property.

23. A method for manufacturing a light emitting display device according to claim 22, wherein the material having an electron transporting property is any one of an alkali metal, an alkaline earth metal, an alkali metal oxide, an alkaline earth metal oxide, an alkali metal nitride, and an alkaline earth metal nitride.

24. A method for manufacturing a light emitting display device according to claim 22, wherein the material having an electron transporting property is a composite material of an electron transporting material or a bipolar material and a material selected from an alkali metal, an alkaline earth metal, an alkali metal oxide, an alkaline earth metal oxide, an alkali metal nitride, and an alkaline earth metal nitride.

25. A method for manufacturing a light emitting display device according to claim 19, wherein the first buffer layer is in contact with the second buffer layer in the first connection portion.

26. A method for manufacturing a light emitting display device according to claim 19, wherein the second auxiliary wiring is in contact with the second electrode in the second connection portion.

27. A method for manufacturing a light emitting display device according to claim 19, wherein the first buffer layer and the second buffer layer are in direct contact.

28. A method for manufacturing a light emitting display device, the method comprising:
forming a first electrode, a first auxiliary wiring, and a second auxiliary wiring over a substrate;
forming a first buffer layer over the first electrode;
forming a light emitting layer over the first electrode;
forming a second buffer layer over the first electrode and the first auxiliary wiring; and
forming a second electrode over the first electrode, the first auxiliary wiring, and the second auxiliary wiring,
wherein a light emitting element comprises the first electrode, the first buffer layer, the light emitting layer, the second buffer layer, and the second electrode,
wherein the first buffer layer comprises a material having a hole transporting property, the material comprising an organic compound and any one of molybdenum oxide, vanadium oxide, ruthenium oxide, rhenium oxide, titanium oxide, chromium oxide, zirconium oxide, hafnium oxide, tantalum oxide, tungsten oxide, and silver oxide,
wherein a first connection portion comprises the first auxiliary wiring, the second buffer layer, and the second electrode, and
wherein a second connection portion comprises the second auxiliary wiring and the second electrode.

29. A method for manufacturing a light emitting display device according to claim 28, wherein the layer comprising a material having a hole transporting property includes the organic compound and a metal compound.

30. A method for manufacturing a light emitting display device according to claim 29, wherein the organic compound is any one of an aromatic amine compound, a carbazole derivative, and an aromatic hydrocarbon (including an aromatic hydrocarbon including at least one vinyl skeleton).

31. A method for manufacturing a light emitting display device according to claim 28, wherein the second buffer layer is formed of a layer comprising a material having an electron transporting property.

32. A method for manufacturing a light emitting display device according to claim 31, wherein the material having an electron transporting property is any one of an alkali metal, an alkaline earth metal, an alkali metal oxide, an alkaline earth metal oxide, an alkali metal nitride, and an alkaline earth metal nitride.

33. A method for manufacturing a light emitting display device according to claim 31, wherein the material having an electron transporting property is a composite material of an electron transporting material or a bipolar material and a material selected from an alkali metal, an alkaline earth metal, an alkali metal oxide, an alkaline earth metal oxide, an alkali metal nitride, and an alkaline earth metal nitride.

34. A method for manufacturing a light emitting display device according to claim 28, wherein the second auxiliary wiring is in contact with the second electrode in the second connection portion.

35. A method for manufacturing a light emitting display device according to claim 28, wherein the first buffer layer and the second buffer layer are in direct contact.

36. A method for manufacturing a light emitting display device, the method comprising:
forming a first electrode, a first auxiliary wiring, and a second auxiliary wiring over a substrate;
forming a first buffer layer over the first electrode and the first auxiliary wiring;
forming a light emitting layer over the first electrode;
forming a second buffer layer over the first electrode; and
forming a second electrode over the first electrode, the first auxiliary wiring, and the second auxiliary wiring,
wherein a light emitting element comprises the first electrode, the first buffer layer, the light emitting layer, the second buffer layer, and the second electrode,
wherein the first buffer layer comprises a material having a hole transporting property, the material comprising an organic compound and any one of molybdenum oxide, vanadium oxide, ruthenium oxide, rhenium oxide, titanium oxide, chromium oxide, zirconium oxide, hafnium oxide, tantalum oxide, tungsten oxide, and silver oxide, wherein a first connection portion comprises the first auxiliary wiring, the first buffer layer, and the second electrode, and wherein a second connection portion comprises the second auxiliary wiring and the second electrode.

37. A method for manufacturing a light emitting display device according to claim 36, wherein the layer comprising a material having a hole transporting property includes the organic compound and a metal compound.

38. A method for manufacturing a light emitting display device according to claim 37, wherein the organic compound is any one of an aromatic amine compound, a carbazole derivative, and an aromatic hydrocarbon (including an aromatic hydrocarbon including at least one vinyl skeleton).

39. A method for manufacturing a light emitting display device according to claim 36, wherein the second buffer layer is formed of a layer comprising a material having an electron transporting property.

40. A method for manufacturing a light emitting display device according to claim 39, wherein the material having an electron transporting property is any one of an alkali metal, an alkaline earth metal, an alkali metal oxide, an alkaline earth metal oxide, an alkali metal nitride, and an alkaline earth metal nitride.

41. A method for manufacturing a light emitting display device according to claim 39, wherein the material having an electron transporting property is a composite material of an electron transporting material or a bipolar material and a material selected from an alkali metal, an alkaline earth metal, an alkali metal oxide, an alkaline earth metal oxide, an alkali metal nitride, and an alkaline earth metal nitride.

42. A method for manufacturing a light emitting display device according to claim 36, wherein the second auxiliary wiring is in contact with the second electrode in the second connection portion.

43. A method for manufacturing a light emitting display device according to claim 36, wherein the first buffer layer and the second buffer layer are in direct contact.

* * * * *